United States Patent
Shimoda et al.

(10) Patent No.: US 7,573,068 B2
(45) Date of Patent: Aug. 11, 2009

(54) TRANSISTOR ARRAY SUBSTRATE AND DISPLAY PANEL

(75) Inventors: Satoru Shimoda, Fussa (JP); Tomoyuki Shirasaki, Higashiyamato (JP); Jun Ogura, Fussa (JP); Minoru Kumagai, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 769 days.

(21) Appl. No.: 11/232,368

(22) Filed: Sep. 21, 2005

(65) Prior Publication Data
US 2006/0098521 A1    May 11, 2006

(30) Foreign Application Priority Data

| Sep. 21, 2004 | (JP) | ............................... 2004-273532 |
| Sep. 21, 2004 | (JP) | ............................... 2004-273580 |
| Sep. 16, 2005 | (JP) | ............................... 2005-269434 |

(51) Int. Cl.
*H01L 33/00* (2006.01)
*H01L 27/32* (2006.01)

(52) U.S. Cl. .................. 257/72; 257/208; 257/E33.055

(58) Field of Classification Search ................... 257/59, 257/72, 79, 81, 83, E33.064, E33.077, E27.131, 257/E27.132, 208, E33.055; 313/500, 505; 349/42, 139, 149, 73, 74; 345/44, 45, 87–92
See application file for complete search history.

(56) References Cited

U.S. PATENT DOCUMENTS

| 6,762,564 | B2 | 7/2004 | Noguchi et al. |
| 6,864,639 | B2 | 3/2005 | Ito |
| 6,933,533 | B2 | 8/2005 | Yamazaki et al. |
| 7,317,429 | B2 | 1/2008 | Shirasaki et al. |
| 2004/0108978 | A1* | 6/2004 | Matsueda et al. ............. 345/76 |

FOREIGN PATENT DOCUMENTS

| CN | 1360350 A | 7/2002 |
| JP | 8-330600 A | 12/1996 |

(Continued)

OTHER PUBLICATIONS

A Japanese Office Action (and English translation thereof) dated Apr. 30, 2008, issued in a counterpart Japanese Application.

*Primary Examiner*—Davienne Monbleau
*Assistant Examiner*—Shweta Mulcare
(74) *Attorney, Agent, or Firm*—Frishauf, Holtz, Goodman & Chick, P.C.

(57) ABSTRACT

A transistor array substrate includes a plurality of driving transistors which are arrayed in a matrix on a substrate. The driving transistor has a gate, a source, a drain, and a gate insulating film inserted between the gate, and the source and drain. A plurality of signal lines are patterned together with the gates of the driving transistors and arrayed to run in a predetermined direction on the substrate. A plurality of supply lines are patterned together with the sources and drains of the driving transistors and arrayed to cross the signal lines via the gate insulating film. The supply line is electrically connected to one of the source and the drain of the driving transistor. A plurality of feed interconnections are formed on the supply lines along the supply lines, respectively.

17 Claims, 27 Drawing Sheets

FOREIGN PATENT DOCUMENTS

| | | |
|---|---|---|
| JP | 2000-349298 A | 12/2000 |
| JP | 2003-133079 A | 5/2003 |
| JP | 2003-195810 A | 7/2003 |
| JP | 2003-330387 A | 11/2003 |
| JP | 2004-101948 A | 4/2004 |
| WO | WO 2004/019314 A1 | 3/2004 |

* cited by examiner

TRANSISTOR ARRAY SUBSTRATE AND DISPLAY PANEL

CROSS-REFERENCE TO RELATED APPLICATIONS

This application is based upon and claims the benefit of priority from prior Japanese Patent Applications No. 2004-273532, filed Sep. 21, 2004; No. 2004-273580, filed Sep. 21, 2004; and No. 2005-269434, filed Sep. 16, 2005, the entire contents of all of which are incorporated herein by reference.

BACKGROUND OF THE INVENTION

1. Field of the Invention

The present invention relates to a transistor array substrate having a plurality of transistors and, more particularly, to a display panel using light-emitting elements which cause self emission when a current is supplied by the transistor array substrate.

2. Description of the Related Art

Organic electroluminescent display panels can roughly be classified into passive driving types and active matrix driving types. Organic electroluminescent display panels of active matrix driving type are more excellent than those of passive driving type because of high contrast and high resolution. In a conventional organic electroluminescent display panel of active matrix display type described in, e.g., Jpn. Pat. Appln. KOKAI Publication No. 8-330600, an organic electroluminescent element (to be referred to as an organic EL element hereinafter), a driving transistor which supplies a current to the organic EL element when a voltage signal corresponding to image data is applied to the gate of the transistor, and a switching transistor which performs switching to supply the voltage signal corresponding to image data to the gate of the driving transistor are arranged for each pixel. In this display panel, when a predetermined scan line is selected, the switching transistor is turned on. At this time, a voltage of level representing the luminance is applied to the gate of the driving transistor through a signal line. Thus, the driving transistor is turned on. A driving current having a magnitude corresponding to the level of the gate voltage is supplied from the power supply to the organic EL element through the source-to-drain path of the driving transistor. Consequently, the EL element emits light at a luminance corresponding to the magnitude of the current. During the period from the end of scan line selection to the next scan line selection, the level of the gate voltage of the driving transistor is continuously held even after the switching transistor is turned off. Hence, the organic EL element keeps emitting light at a luminance corresponding to the magnitude of the driving current corresponding to the voltage.

To drive the organic electroluminescent display panel, a driving circuit is provided around the display panel to apply a voltage to the scan lines, signal lines, and power supply lines laid on the display panel.

In the conventional organic electroluminescent display panel of active matrix driving type, interconnections such as a power supply line to supply a current to an organic EL element are patterned simultaneously in the thin-film transistor patterning step by using the material of a thin-film transistor such as a switching transistor or driving transistor. More specifically, in manufacturing the display panel, a conductive thin film as a prospective electrode of a thin-film transistor is subjected to photolithography and etching to form the electrode of a thin-film transistor from the conductive thin film. At the same time, an interconnection connected to the electrode is also formed. For this reason, when the interconnection is formed from the conductive thin film, the thickness of the interconnection equals that of the thin-film transistor.

The electrode of the thin-film transistor is designed assuming that it functions as a transistor. In other words, the electrode is not designed assuming that it supplies a current to a light-emitting element. Hence, the thin-film transistor is thin literally. If a current is supplied from the interconnection to a plurality of light-emitting elements, a voltage drop occurs, or the current flow through the interconnection delays due to the electrical resistance of the interconnection. To suppress the voltage drop or interconnection delay, the resistance of the interconnection is preferably low. If the resistance of the interconnection is reduced by making a metal layer serving as the source and drain of the transistor or a metal layer serving as the gate electrode thick, or patterning the metal layers considerably wide to sufficiently flow the current through the metal layers, the overlap area of the interconnection on another interconnection or conductor when viewed from the upper side increases, and a parasitic capacitance is generated between them. This retards the flow of the current. Alternatively, in a so-called bottom emission structure which emits EL light from the transistor array substrate side, light emitted from the EL elements is shielded by the interconnections, resulting in a decrease in opening ratio, i.e., the ratio of the light emission area. If the gate electrode of the thin-film transistor is made thick to lower the resistance, a planarization film (corresponding to a gate insulating film when the thin-film transistor has, e.g., an inverted stagger structure) to eliminate the step of the gate electrode must also be formed thick. This may lead to a large change in transistor characteristic. When the source and drain are formed thick, the etching accuracy of the source and drain degrades. This may also adversely affect the transistor characteristic.

BRIEF SUMMARY OF THE INVENTION

It is an object of the present invention to satisfactorily drive a light-emitting element while suppressing any voltage drop and signal delay.

A transistor array substrate according to a first aspect of the present invention comprises:

a substrate;

a plurality of driving transistors which are arrayed in a matrix on the substrate, each of the driving transistors having a gate, a source, a drain, and a gate insulating film inserted between the gate, and the source and drain;

a plurality of signal lines which are patterned together with the gates of the plurality of driving transistors and arrayed to run in a predetermined direction on the substrate;

a plurality of supply lines which are patterned together with the sources and drains of the plurality of driving transistors and arrayed to cross the plurality of signal lines via the gate insulating film, each of the supply lines being electrically connected to one of the source and the drain of the driving transistor; and a plurality of feed interconnections which are formed on the plurality of supply lines along the plurality of supply lines, respectively.

Preferably, a substrate according to claim 1, further comprising a plurality of scan lines which are patterned together with the sources and drains of the plurality of driving transistors and arrayed to cross the plurality of supply lines via the gate insulating film.

Preferably, a substrate according to claim 2, which further comprises a plurality of switch transistors which are arrayed in a matrix on the substrate, each of the switch transistors having the gate insulating film inserted between a gate and a source and drain, and in which one of the source and drain of each of the plurality of switch transistors is electrically connected to the other of the source and drain of a corresponding one of the plurality of driving transistors, the gate of each of the plurality of switch transistors is electrically connected to the scan line through a contact hole formed in the gate insulating film, and the other of the source and drain of each of the plurality of switch transistors is electrically connected to the signal line through a contact hole formed in the gate insulating film.

Preferably, a substrate according to claim 2, which further comprises a plurality of holding transistors which are arrayed in a matrix on the substrate, each of the holding transistors having the gate insulating film inserted between a gate and a source and drain, and in which one of the source and drain of each of the plurality of holding transistors is electrically connected to the gate of a corresponding one of the plurality of driving transistors through a contact hole formed in the gate insulating film, the other of the source and drain of each of the plurality of holding transistors is electrically connected to one of the supply line and the scan line, and the gate of each of the plurality of holding transistors is electrically connected to the scan line through a contact hole formed in the gate insulating film.

A display panel according to a second aspect of the present invention is a display panel comprising:

a substrate;

a plurality of driving transistors which are arrayed in a matrix on the substrate, each of the driving transistors having a gate, a source, a drain, and a gate insulating film inserted between the gate, and the source and drain;

a plurality of signal lines which are patterned together with the gates of the plurality of driving transistors and arrayed to run in a predetermined direction on the substrate;

a plurality of supply lines which are patterned together with the sources and drains of the plurality of driving transistors and arrayed to cross the plurality of signal lines via the gate insulating film, each of the supply lines being electrically connected to one of the source and the drain of the driving transistor; and a plurality of feed interconnections which are connected to the plurality of supply lines along the plurality of supply lines;

a plurality of pixel electrodes each of which is electrically connected to the other of the source and the drain of each of the plurality of driving transistors;

a plurality of light-emitting layers which are formed on the plurality of pixel electrodes, respectively; and a counter electrode which covers the plurality of light-emitting layers.

Preferably, a panel according to claim 13, further comprising a plurality of scan lines which are patterned together with the sources and drains of the plurality of driving transistors and arrayed to cross the plurality of supply lines via the gate insulating film.

According to this aspect, the signal lines are patterned together with the gates of the driving transistors. However, since the feed interconnections are stacked on the supply lines, the feed interconnections are formed separately for the drains, sources, and gates of the driving transistors. For this reason, the feed interconnection can be made thick without increasing its width, and the resistance of the feed interconnection can be reduced. Hence, even when a signal is output to the driving transistor and pixel electrode through the feed interconnection, the voltage drop and signal delay can be suppressed.

When the feed interconnections are to be formed by electroplating, the supply lines are formed on the signal lines. When the structure is dipped in a plating solution while a voltage is applied to the supply lines in the manufacturing step of the transistor array substrate and the display panel, the feed interconnections can be grown on the supply lines.

According to this aspect, since the feed interconnections can be made thick, the resistance of the feed interconnections can be reduced. When the resistance of the feed interconnections decreases, the signal delay and voltage drop can be suppressed.

A display panel manufacturing method according to a display panel manufacturing method according to a fourth aspect of the present invention comprises; patterning a plurality of pixel electrodes on a panel to be arrayed in a matrix; forming an interconnection made of metal between the pixel electrodes; coating a surface of the interconnection with a liquid repellent conductive layer; and forming an organic compound layer by applying an organic compound-containing solution to the electrode.

A thick interconnection can suppress the voltage drop and can also be used as a partition wall in forming an organic compound-containing solution. Since the liquid repellent conductive layer exhibits liquid repellency, an organic compound layer can satisfactorily be patterned. A liquid repellent conductive layer containing, e.g., a triazine compound can selectively be formed on a metal surface so as to exhibit liquid repellency but cannot be formed on the surface of an insulator or a metal oxide to exhibit liquid repellency. In addition, the liquid repellent conductive layer is formed on the metal surface very thin. Hence, the electrical conductivity on the metal surface is not lost.

DETAILED DESCRIPTION OF THE INVENTION

First Embodiment

The best mode for carrying out the present invention will be described below with reference to the accompanying drawing. Various kinds of limitations which are technically preferable in carrying out the present invention are added to the embodiments to be described below. However, the spirit and scope of the present invention are not limited to the following embodiments and illustrated examples.

[Overall Arrangement of EL Display Panel]

Figure 1:
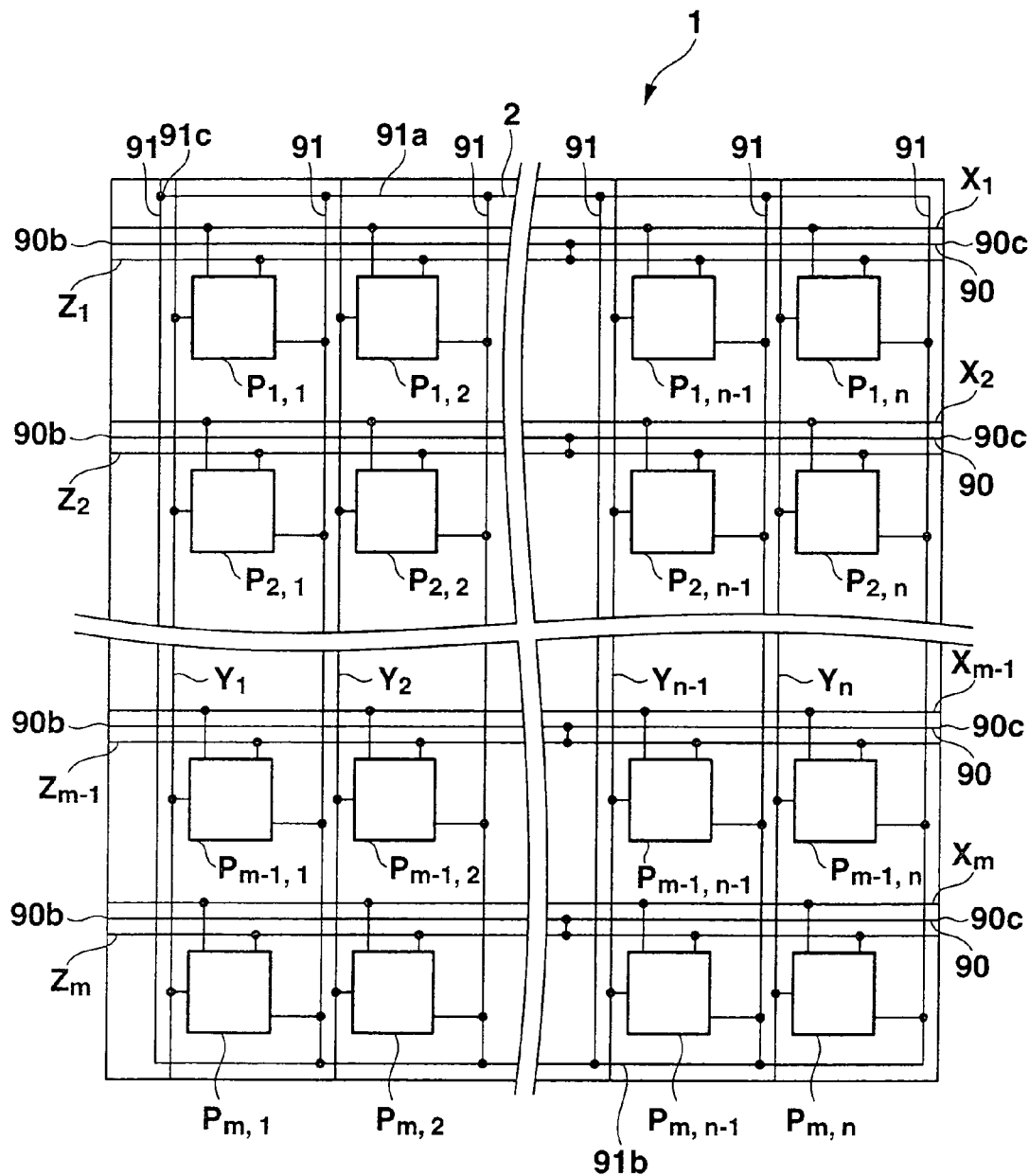
FIG. 1 is a view showing the circuit arrangement of an EL display panel together with an insulating substrate.

FIG. 1 is a schematic view showing an EL display panel 1 of active matrix driving type. As shown in FIG. 1, the EL display panel 1 comprises an insulating substrate 2, n (a plurality of) signal lines $Y_1$ to $Y_n$, m (a plurality of) scan lines $X_1$ to $X_m$, m (a plurality of) supply lines $Z_1$ to $Z_m$, (m×n) pixel circuits $P_{1,1}$ to $P_{m,n}$, a plurality of feed interconnections 90, and common interconnections 91. The insulating substrate 2 is optically transparent and has a flexible sheet shape or a rigid plate shape. The signal lines $Y_1$ to $Y_n$ are arrayed on the insulating substrate 2 in parallel to each other. The scan lines $X_1$ to $X_m$ are arrayed on the insulating substrate 2 to be perpendicularly to the signal lines $Y_1$ to $Y_n$ when the insulating substrate 2 is viewed from the upper side. The supply lines $Z_1$ to $Z_m$ are arrayed on the insulating substrate 2 between the scan lines $X_1$ to $X_m$ to be parallel to them so that the supply lines and scan lines alternate. The pixel circuits $P_{1,1}$ to $P_{m,n}$ are arrayed on the insulating substrate 2 in a matrix along the signal lines $Y_1$ to $Y_n$ and scan lines $X_1$ to $X_m$. The feed interconnections 90 are provided in parallel to the supply lines $Z_1$ to $Z_m$ when viewed from the upper side. The common interconnections 91 are provided in parallel to the signal lines $Y_1$ to $Y_n$ when viewed from the upper side.

In the following description, the direction in which the signal lines $Y_1$ to $Y_n$ run will be defined as the vertical direction (column direction), and the direction in which the scan lines $X_1$ to $X_m$ run will be defined as the horizontal direction (row direction). In addition, m and n are natural numbers (m≧2, n≧2). The subscript added to a scan line X represents the sequence from the top in FIG. 1. The subscript added to a supply line Z represents the sequence from the top in FIG. 1. The subscript added to a signal line Y represents the sequence from the left in FIG. 1. The first subscript added to a pixel circuit P represents the sequence from the top, and the second subscript represents the sequence from the left. More specifically, let i be an arbitrary natural number of 1 to m, and j be an arbitrary natural number of 1 to n, a scan line $X_i$ is the ith row from the top, a supply line $Z_i$ is the ith row from the top, a signal line $Y_j$ is the jth column from the left, and a pixel circuit $P_{i,j}$ is located on the ith row from the top and the jth column from the left. The pixel circuit $P_{i,j}$ is connected to the scan line $X_i$, supply line $Z_i$, and signal line $Y_j$.

The total number of feed interconnections 90 is m. A voltage VL to flow a write current and a voltage VH to flow a driving current are applied from a left terminal 90b and right terminal 90c on the insulating substrate 2 to each feed interconnection 90. For this reason, the voltage drop of the feed interconnection 90 can be suppressed small as compared to when applying the voltages VL and VH from one of the left terminal 90b and right terminal 90c. The feed interconnections 90 are formed on the upper surfaces of the supply lines $Z_1$ to $Z_m$ to be electrically connected to them.

The total number of common interconnections 91 is n+1. Two common interconnections 91 adjacent in the row direction also function as partition walls to partition, in film formation, organic EL layers 20b of organic EL elements (light-emitting elements) 20 arranged between them. The common interconnections 91 are connected to a lead interconnection 91a on the front side and to a lead interconnection 91b on the rear side. The lead interconnections 91a and 91b have the same thickness as the common interconnections 91 and also function as partition walls to partition the organic EL layers 20b in the fore-and-aft direction in film formation. The common interconnections 91 are connected to an external device through interconnection terminals 91c. A common potential Vcom is applied to the common interconnections 91.

In the EL display panel 1, regions partitioned in a matrix by the scan lines $X_1$ to $X_m$ and signal lines $Y_1$ to $Y_n$ form pixels. Each of the pixel circuits $P_{1,1}$ to $P_{m,n}$ is provided in one region.

[Circuit Arrangement of Pixel Circuit]

Figure 2:
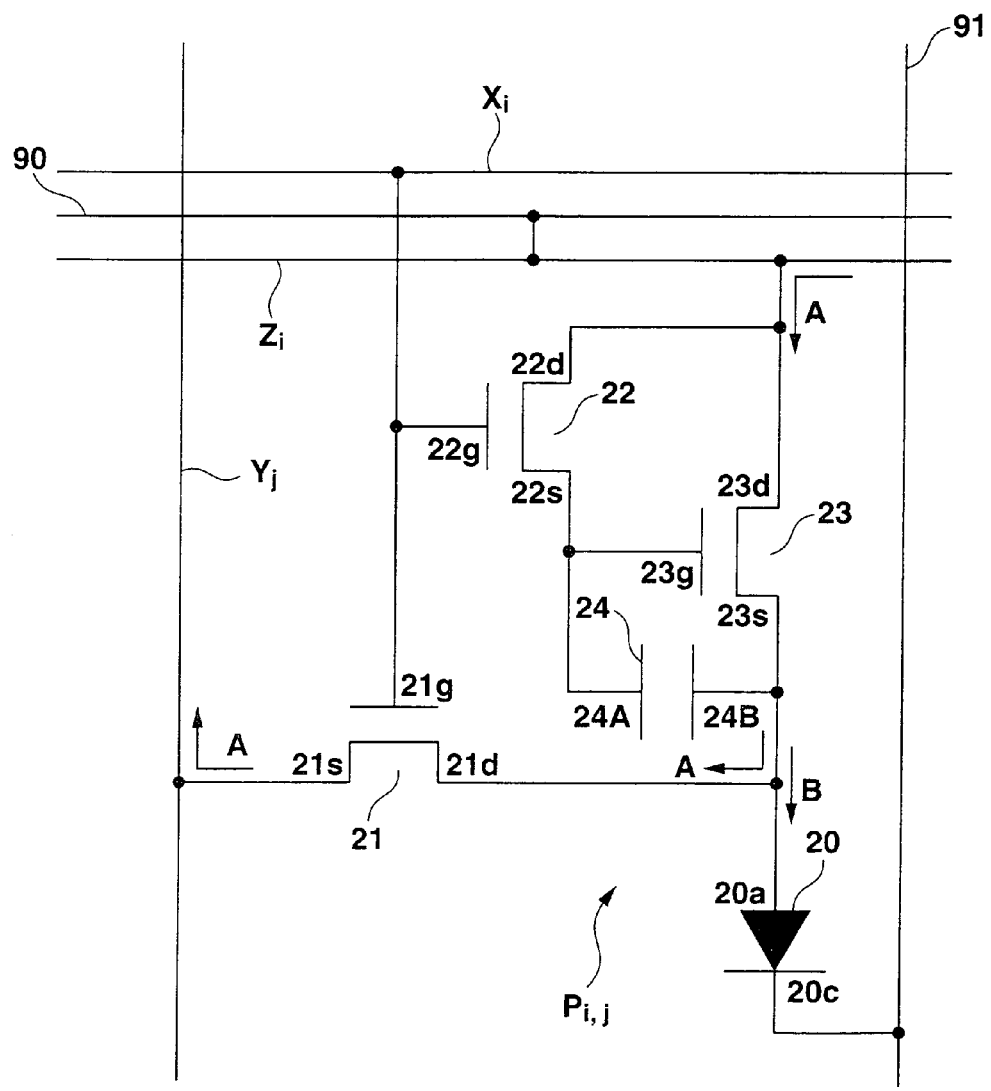
FIG. 2 is an equivalent circuit diagram of a pixel circuit of the EL display panel.
Figure 3:
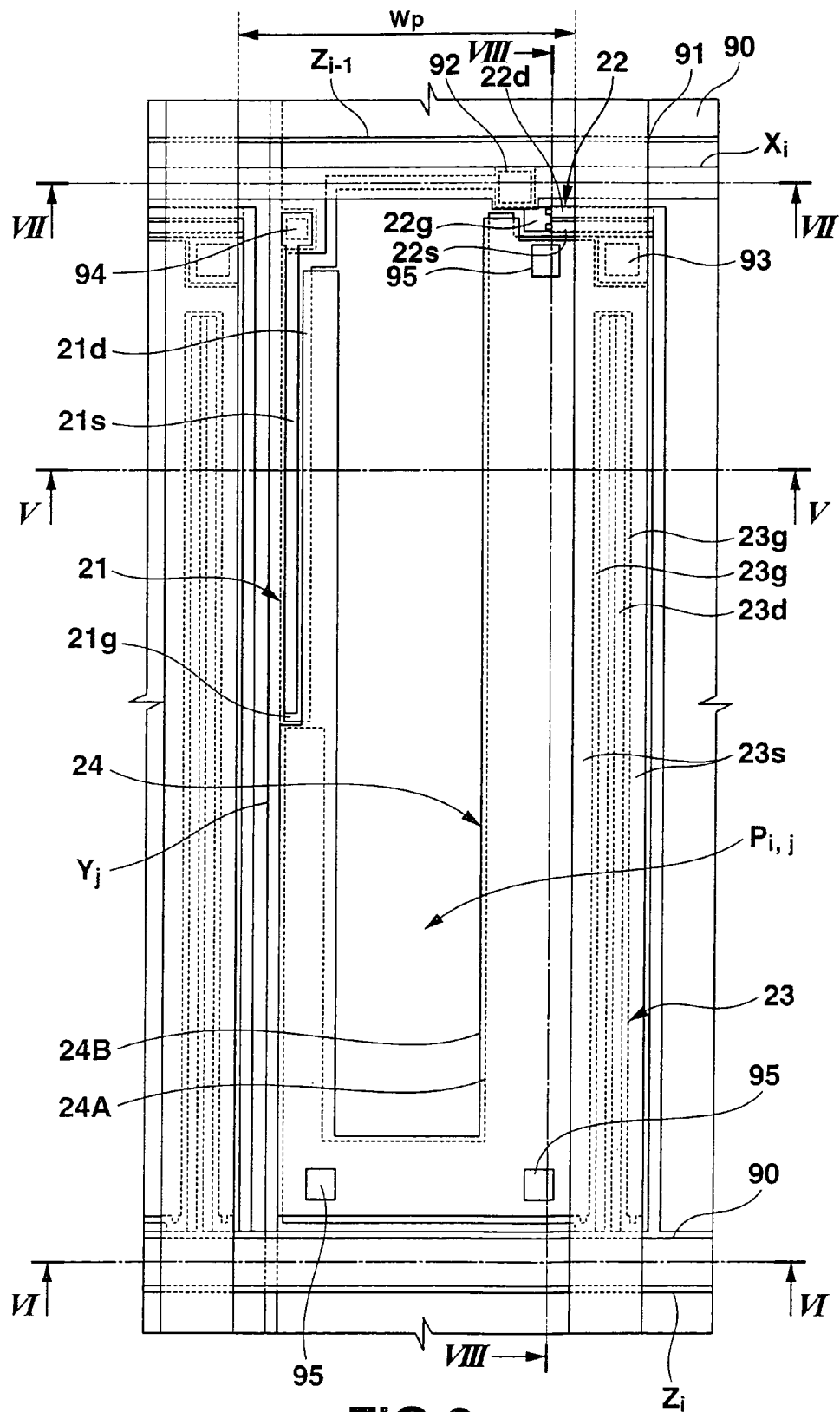
FIG. 3 is a plan view showing the electrode of the pixel circuit of the EL display panel.
Figure 4:
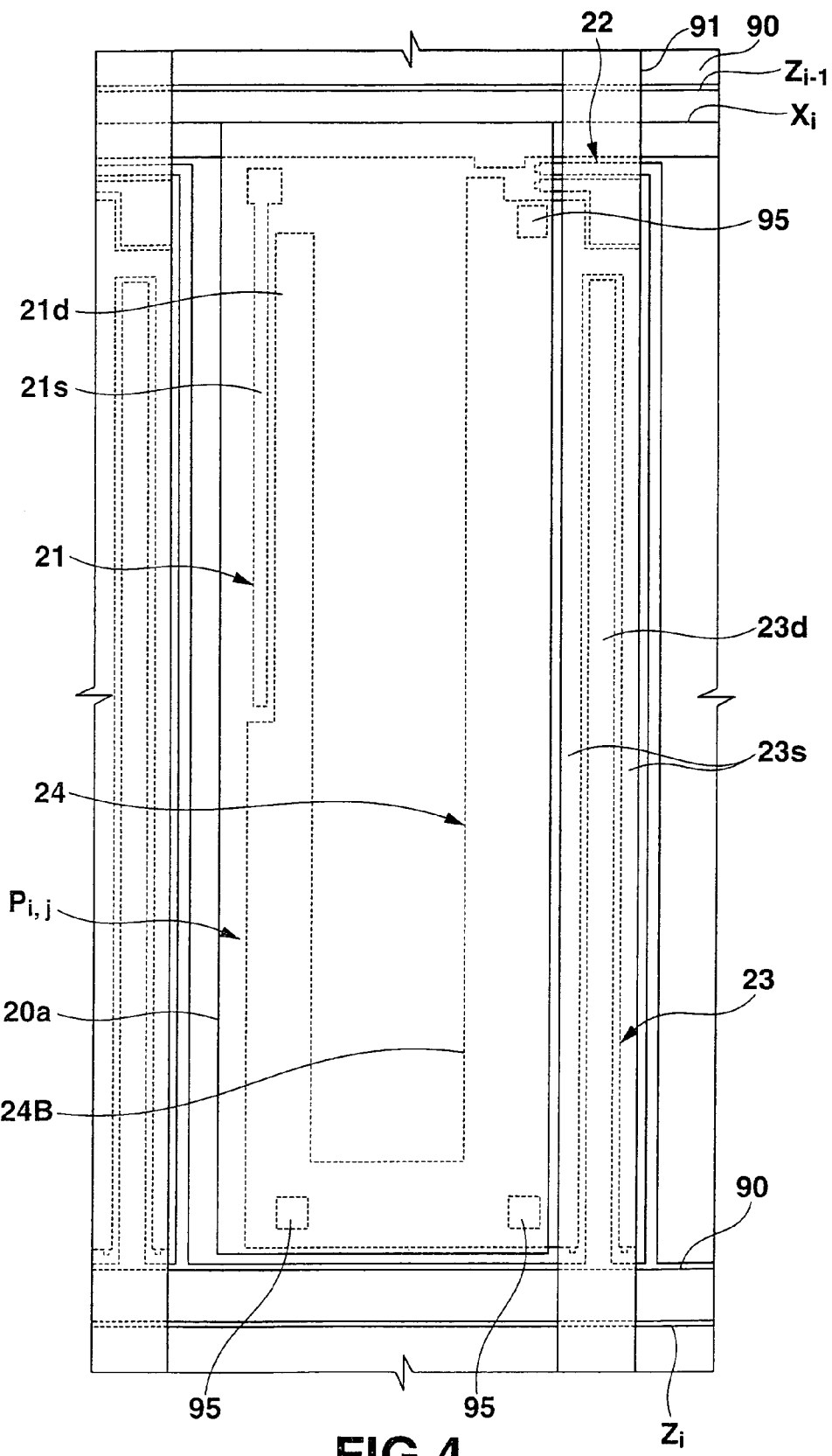
FIG. 4 is a plan view showing the electrode of the pixel circuit of the EL display panel.

The pixel circuits $P_{1,1}$ to $P_{m,n}$ have the same structure. So, the arbitrary pixel circuit $P_{i,j}$ of the pixel circuits $P_{1,1}$ to $P_{m,n}$ will be described. FIG. 2 is an equivalent circuit diagram of the pixel circuit $P_{i,j}$. FIGS. 3 and 4 are plan views mainly showing the electrode of the pixel circuit $P_{i,j}$. For the illustrative convenience, FIG. 3 does not illustrate a pixel electrode 20a of the pixel circuit $P_{i,j}$. FIG. 4 does not illustrate the electrode on the lower side of the pixel circuit $P_{i,j}$.

The pixel circuit $P_{i,j}$ comprises the organic EL element 20 serving as a pixel, three N-channel amorphous silicon thin-film transistors (to be simply referred to as transistors hereinafter) 21, 22, and 23 arranged around the organic EL element 20, and a capacitor 24. The first transistor 21 will be referred to as the switch transistor 21, the second transistor 22 as the holding transistor 22, and the third transistor 23 as the driving transistor 23 hereinafter.

As shown in FIG. 2, in the switch transistor 21 of the pixel circuit $P_{i,j}$, a source 21s is electrically connected to the signal line $Y_j$. A drain 21d is electrically connected to the pixel electrode 20a of the organic EL element 20, a source 23s of the driving transistor 23, and an upper electrode 24B of the capacitor 24. A gate 21g of the first transistor is electrically connected to a gate 22g of the holding transistor 22 and the scan line $X_i$.

In the holding transistor 22, a source 22s is electrically connected to a gate 23g of the driving transistor 23 and a lower electrode 24A of the capacitor 24. A drain 22d of the second transistor 22 is electrically connected to a drain 23d of the driving transistor 23 and the supply line $Z_i$. The gate 22g is electrically connected to the gate 21g of the switch transistor 21 and the scan line $X_i$.

In the driving transistor 23, the source 23s is electrically connected to the pixel electrode 20a of the organic EL element 20, the drain 21d of the switch transistor 21, and the electrode 24B of the capacitor 24. The drain 23d of the transistor 23 is electrically connected to the drain 22d of the holding transistor 22 and the supply line $Z_i$. The gate 23g is electrically connected to the source 22s of the holding transistor 22 and the lower electrode 24A of the capacitor 24.

[Planar Layout]

As shown in FIGS. 1 to 4, when the entire EL display panel 1 is viewed from the upper side, the scan lines $X_1$ to $X_m$ and supply lines $Z_1$ to $Z_m$ are alternately arrayed. The feed interconnections 90 overlap the supply lines $Z_1$ to $Z_m$. The signal lines $Y_1$ to $Y_n$ and common interconnections 91 are alternately arrayed.

As shown in FIGS. 3 and 4, a focus is placed on the arbitrary pixel circuit $P_{i,j}$ of the pixel circuits $P_{1,1}$ to $P_{m,n}$. When viewed from the upper side, a rectangular region is formed between the signal line Y and the common interconnection 91 and between the scan line $X_i$ and the supply line $Z_i$ while being surrounded by them. The pixel electrode 20a of the organic EL element 20 is arranged in the rectangular region. Hence, when the entire EL display panel 1 is viewed from the upper side, the plurality of pixel electrodes 20a are arrayed in a matrix. The pixel electrode 20a is formed into a rectangular shape long in the vertical direction when viewed from the upper side.

When viewed from the upper side, the switch transistor 21 is arranged along the signal line $Y_j$. The switch transistor 21 overlaps the edge of the pixel electrode 20a.

When viewed from the upper side, the holding transistor 22 is arranged along the scan line $X_i$. The holding transistor 22 overlaps the edge of the pixel electrode 20a.

When viewed from the upper side, the driving transistor 23 is arranged to overlap the common interconnection 91.

When viewed from the upper side, the capacitor 24 is arranged along the common interconnection 91, supply line $Z_i$, and signal line $Y_j$ and overlaps the edge of the pixel electrode 20a.

The entire EL display panel 1 is viewed from the upper side, and a focus is placed on only the switch transistors 21 of the pixel circuits $P_{1,1}$ to $P_{m,n}$ The plurality of switch transistors 21 are arrayed on the insulating substrate 2 in a matrix. When a focus is placed on only the holding transistors 22 of the pixel circuits $P_{1,1}$ to $P_{m,n}$ viewed from the upper side, the plurality of holding transistors 22 are arrayed on the insulating substrate 2 in a matrix. When a focus is placed on only the driving transistors 23 of the pixel circuits $P_{1,1}$ to $P_{m,n}$ viewed from the upper side, the plurality of driving transistors 23 are arrayed on the insulating substrate 2 in a matrix.

[Layer Structure of EL Display Panel]

Figure 5:
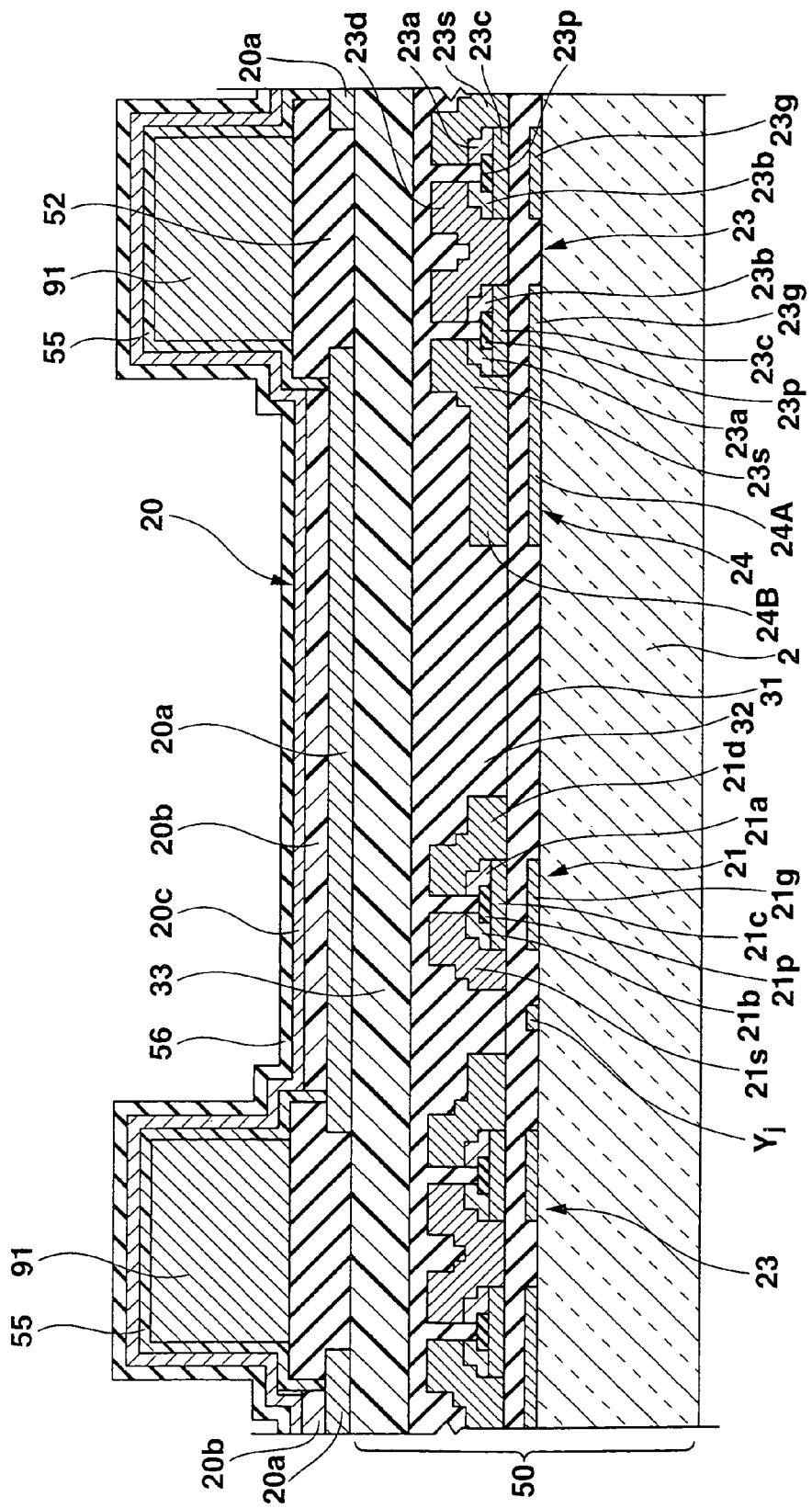
FIG. 5 is a sectional view taken along a line V-V in FIG. 3.
Figure 6:
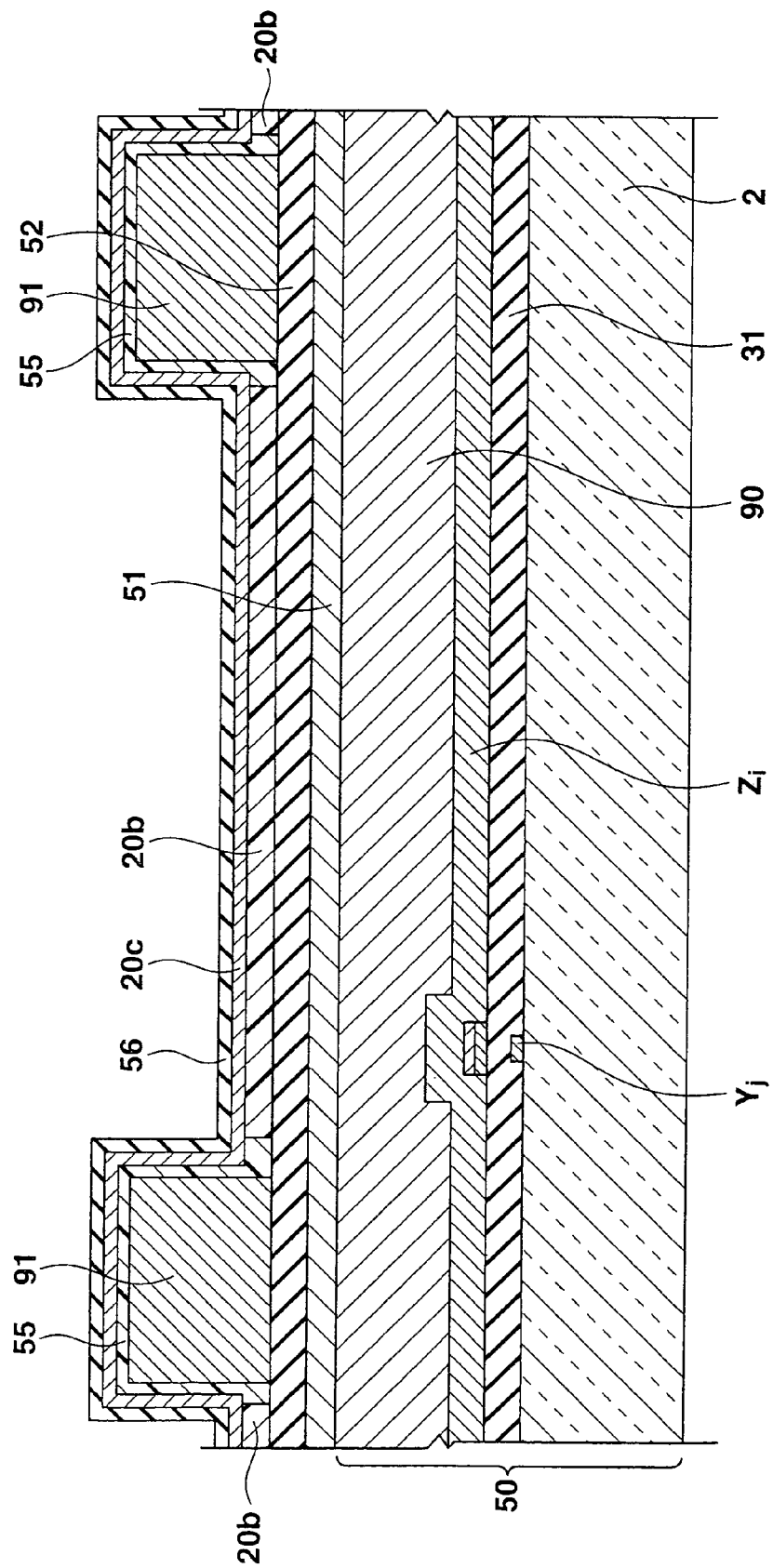
FIG. 6 is a sectional view taken along a line VI-VI in FIG. 3.
Figure 7:
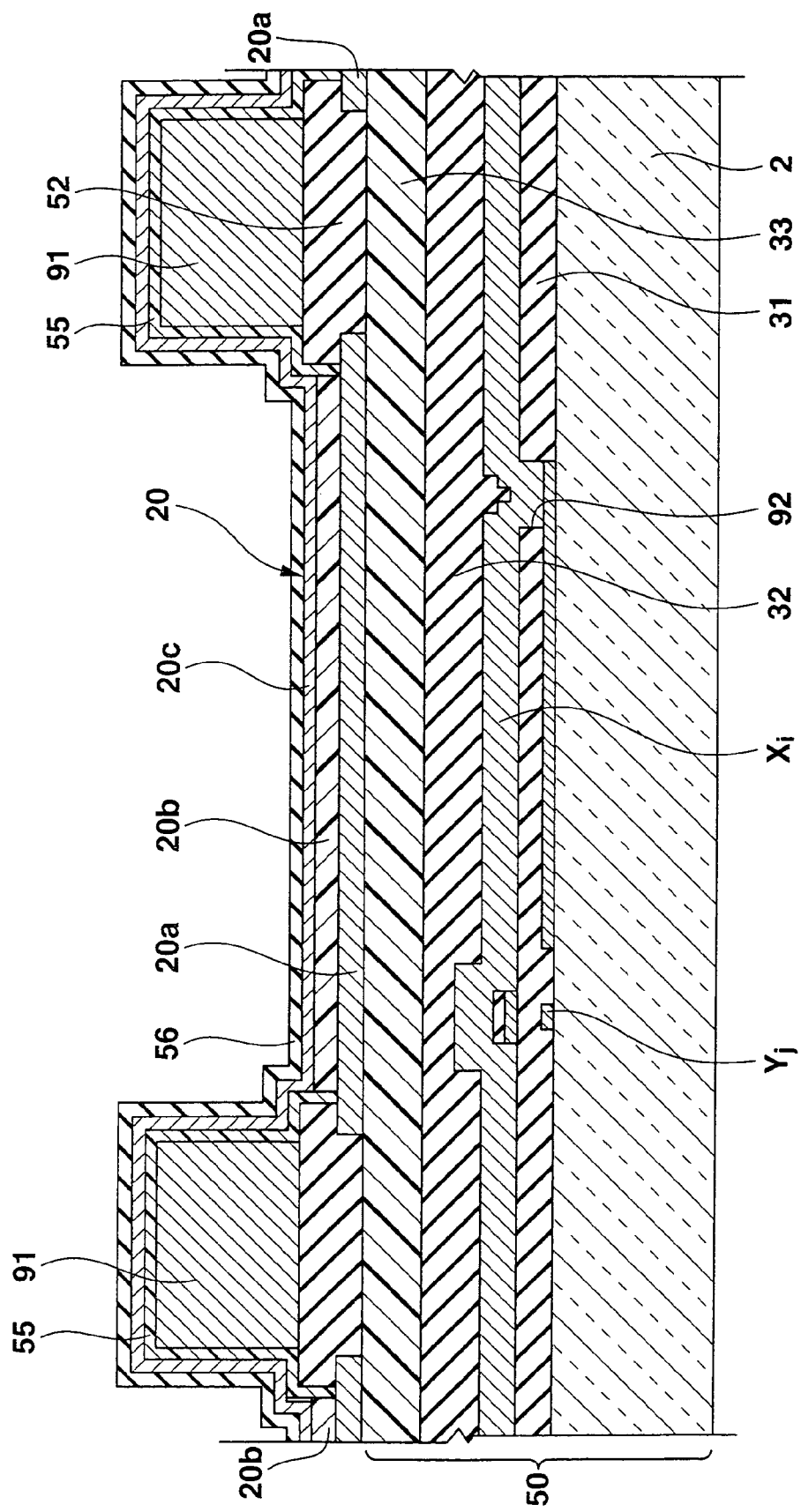
FIG. 7 is a sectional view taken along a line VII-VII in FIG. 3.
Figure 8:
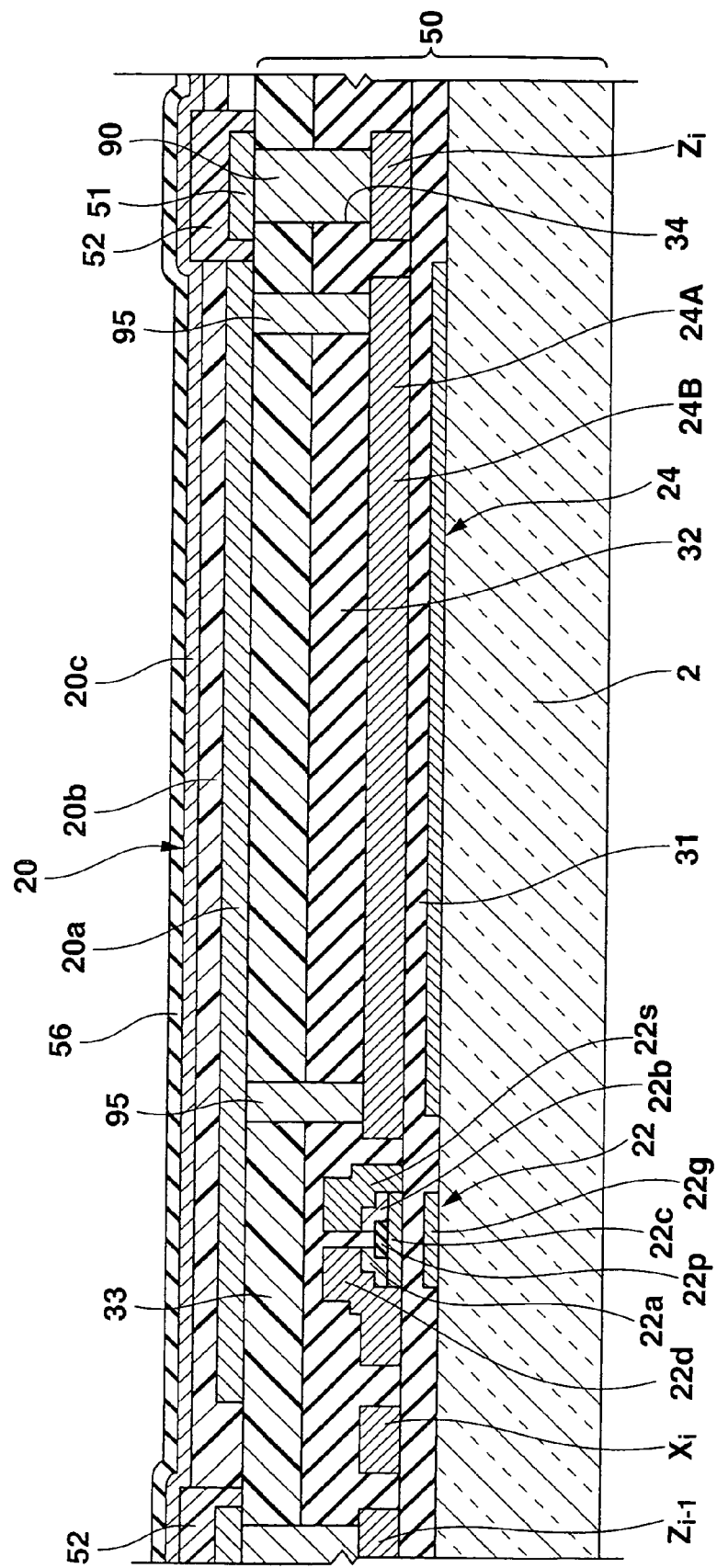
FIG. 8 is a sectional view taken along a line VIII-VIII in FIG. 3.

The layer structure of the EL display panel 1 will be described. The layer structure of the three transistors 21 to 23 will be described first with reference to FIGS. 5 to 8. FIG. 5 is a sectional view taken along a line V-V in FIG. 3 in the direction of thickness of the insulating substrate 2. FIG. 6 is a sectional view taken along a line VI-VI in FIG. 3 in the direction of thickness of the insulating substrate 2. FIG. 7 is a sectional view taken along a line VII-VII in FIG. 3 in the direction of thickness of the insulating substrate 2. FIG. 8 is a sectional view taken along a line VIII-VIII in FIG. 3 in the direction of thickness of the insulating substrate 2. FIGS. 5 to 7 also show part of a pixel circuit $P_{i,j-1}$ next to the pixel circuit $P_{i,j}$.

As shown in FIG. 5, the switch transistor 21 includes the gate 21g, gate insulating film 31, semiconductor film 21c, channel protective film 21p, impurity-doped semiconductor films 21a and 21b, drain 21d, and source 21s. The gate 21g is formed on the transparent insulating substrate 2. The gate insulating film 31 has a part formed on the gate 21g. The semiconductor film 21c opposes the gate 21g via the part of the gate insulating film 31. The channel protective film 21p is formed on the central portion of the semiconductor film 21c. The impurity-doped semiconductor films 21a and 21b are formed on two end portions of the semiconductor film 21c to be spaced apart from each other and partially overlap the channel protective film 21p. The drain 21d is formed on one impurity-doped semiconductor film 21a. The source 21s is formed on the other impurity-doped semiconductor film 21b. The drain 21d and source 21s can have either a single-layer structure or a layered structure including two or more layers.

As shown in FIG. 8, the holding transistor 22 includes the gate 22g, gate insulating film 31, semiconductor film 22c, channel protective film 22p, impurity-doped semiconductor films 22a and 22b, drain 22d, and source 22s. The gate 22g is formed on the insulating substrate 2. The gate insulating film 31 has a part formed on the gate 22g. The semiconductor film 22c opposes the gate 22g via the part of the gate insulating film 31. The channel protective film 22p is formed on the central portion of the semiconductor film 22c. The impurity-doped semiconductor films 22a and 22b are formed on two ends of the semiconductor film 22c to be spaced apart from each other and partially overlap the channel protective film 22p. The drain 22d is formed on one impurity-doped semiconductor film 22a. The source 22s is formed on the other impurity-doped semiconductor film 22b. The drain 22d and source 22s can have either a single-layer structure or a layered structure including two or more layers.

As shown in FIG. 5, the driving transistor 23 includes the gate 23g, gate insulating film 31, semiconductor film 23c, channel protective film 23p, impurity-doped semiconductor films 23a and 23b, drain 23d, and source 23s. The gate 23g is formed on the insulating substrate 2. The gate insulating film 31 has a part formed on the gate 23g. The semiconductor film 23c opposes the gate 23g via the part of the gate insulating film 31. The channel protective film 23p is formed on the central portion of the semiconductor film 23c. The impurity-doped semiconductor films 23a and 23b are formed on two ends of the semiconductor film 23c to be spaced apart from each other and partially overlap the channel protective film 23p. The drain 23d is formed on one impurity-doped semiconductor film 23a. The source 23s is formed on the other impurity-doped semiconductor film 23b. When viewed from the upper side, the source 23s of the driving transistor 23 has a U shape so that the channel width of the driving transistor 23 is large. The drains 21d to 23d and sources 21s to 23s of the transistors 21 or 23 are formed by patterning the same material layer.

The layer structure of the capacitor 24 will be described next. As shown in FIGS. 5 and 8, the capacitor 24 includes the lower electrode 24A, gate insulating film 31, and upper electrode 24B. The lower electrode 24A is formed on the insulating substrate 2. The gate insulating film 31 has a part formed on the lower electrode 24A. The upper electrode 24B opposes the lower electrode 24A via the part of the gate insulating film 31.

Figure 9:
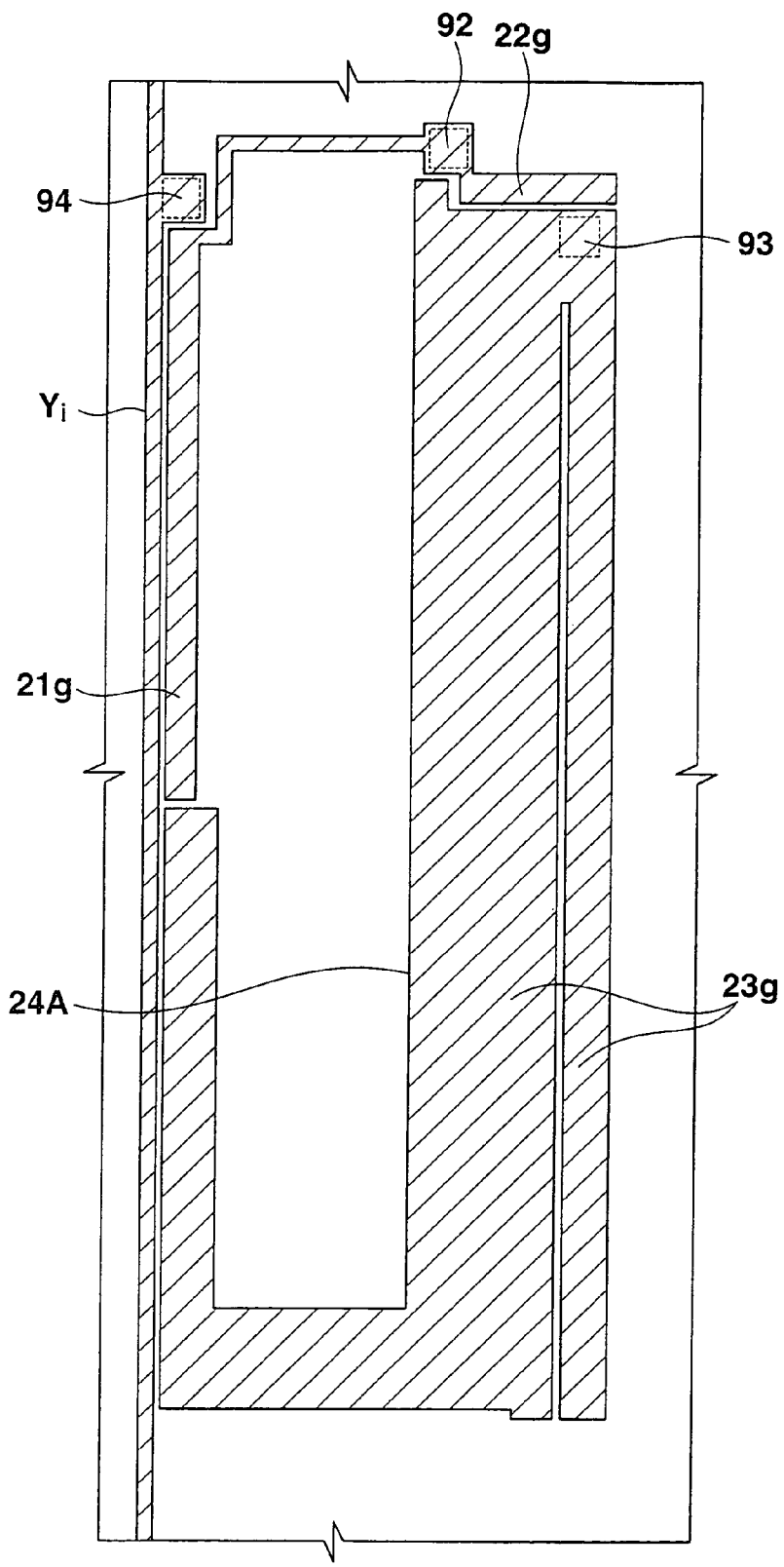
FIG. 9 is a plan view showing a state wherein a gate layer is patterned.
Figure 10:
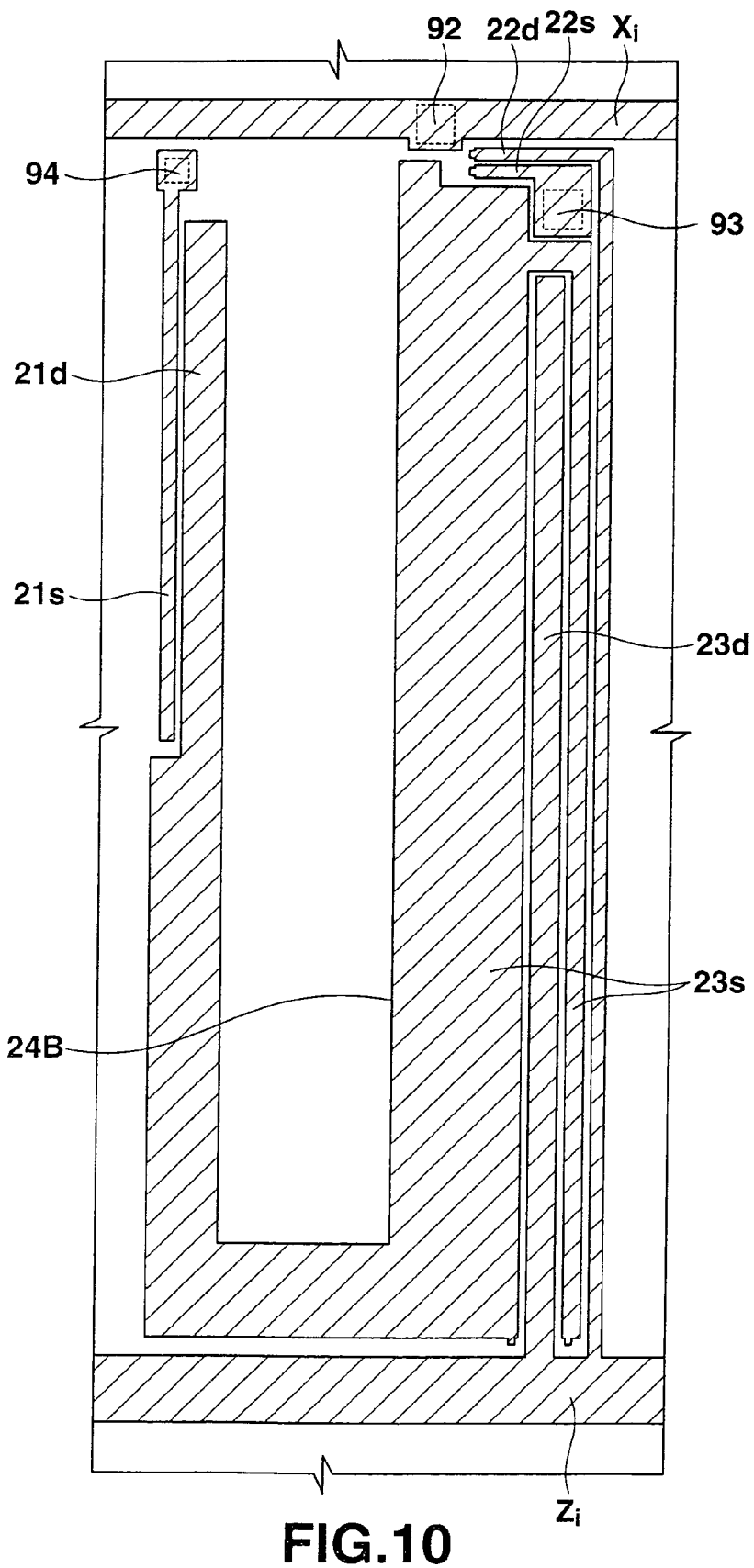
FIG. 10 is a plan view showing a state wherein a drain layer is patterned.
Figure 11:
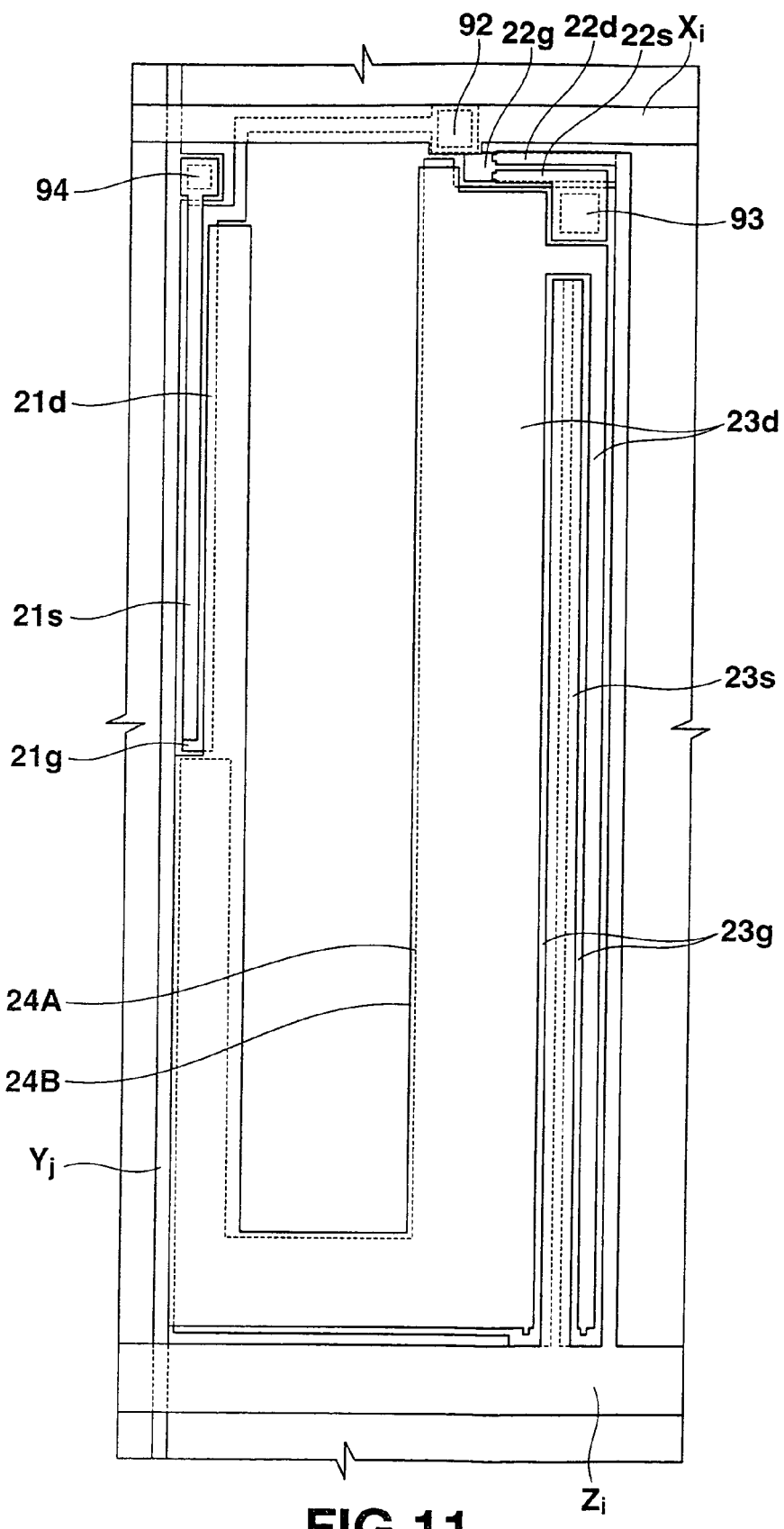
FIG. 11 is a plan view showing a state wherein the drain layer is superposed on the patterned gate layer.

The relationship between the layers of the transistors 21 to 23 and the capacitor 24, the signal lines $Y_1$ to $Y_n$, the scan lines $X_1$ to $X_m$, and the supply lines $Z_1$ to $Z_m$ will be described next with reference to FIGS. 5 to 11. FIGS. 9 to 11 are plan views of the electrodes of the transistors 21 to 23.

As shown in FIGS. 5 to 8 and 9, the gates 21g, 22g, 23g of said three transistors 21, 22, 23, and the lower electrodes 24A of the capacitors 24 of the pixel circuits $P_{1,1}$ to $P_{m,n}$, and the signal lines $Y_1$ to $Y_n$ are formed, using photolithography and etching, by patterning a single conductive film formed on the entire surface of the insulating substrate 2. The conductive film as the base of the gates 21g 22g 23g of said three transistors 21, 22, 23, the lower electrodes 24A of the capacitors 24, and the signal lines $Y_1$ to $Y_n$ will be referred to as a gate layer hereinafter. FIG. 9 is a plan view showing a state wherein the gate layer is patterned.

As shown in FIGS. 5 to 8, the gate insulating film 31 is formed on the entire surface as a film common to all the transistors 21, 22, 23, and capacitors 24 of the pixel circuits $P_{1,1}$ to $P_{m,n}$. Hence, the gate insulating film 31 covers the gates 21g, 22g, 23g of the respecting transistors 21, 22, 23, the lower electrodes 24A of the capacitors 24, and the signal lines $Y_1$ to $Y_n$.

As shown in FIGS. 5 to 8 and 10, the drains 21d and sources 21s of the switch transistors 21, the drains 22d and sources 22s of the holding transistors 22, the drains 23d and sources 23s of the driving transistors 23, and the lower electrodes 24A of the capacitors 24 of the pixel circuits $P_{1,1}$ to $P_{m,n}$, the scan lines $X_1$ to $X_m$, and the supply lines $Z_1$ to $Z_m$ are formed, using photolithography and etching, by patterning a single conductive film formed on the entire surface of the gate insulating film 31. The conductive film as the base of the drains 21d and sources 21s of the switch transistors 21, the drains 22d and sources 22s of the holding transistors 22, the drains 23d and sources 23s of the driving transistors 23, the electrodes 24A of the capacitors 24, the scan lines $X_1$ to $X_m$, and the supply lines $Z_1$ to $Z_m$ will be referred to as a drain layer hereinafter.

FIG. 10 is a plan view showing a state wherein the drain layer is patterned. FIG. 11 is a plan view showing a state wherein the patterned drain layer is superposed on the patterned gate layer.

As shown in FIGS. 3, 7, 9, and 10, the scan line $X_i$ is electrically connected to the gate 21g of the switch transistor 21 and the gate 22g of the holding transistor 22 through a contact hole 92 formed in the gate insulating film 31. The signal line $Y_j$ is electrically connected to the source 21s of the switch transistor 21 through a contact hole 94 formed in the gate insulating film 31. The source 22s of the holding transistor 22 is electrically connected to the gate 23g of the driving transistor 23 through a contact hole 93 formed in the gate insulating film 31.

As shown in FIGS. 5 to 8, the switch transistors 21, holding transistors 22, driving transistors 23, scan lines $X_1$ to $X_m$, and supply lines $Z_1$ to $Z_m$ are covered with a protective insulating film 32 formed on the entire surface. The protective insulating film 32 is divided into strips at the overlap portions on the supply lines $Z_1$ to $Z_m$. This will be described later in detail.

A planarization film 33 is formed on the protective insulating film 32 so that the three-dimensional pattern of the switch transistors 21, holding transistors 22, driving transistors 23, scan lines $X_1$ to $X_m$, and supply lines $Z_1$ to $Z_m$ is eliminated by the planarization film 33. That is, the surface of the planarization film 33 is flat. The planarization film 33 is formed by hardening a resin. The planarization film 33 is divided into strips at the overlap portions on the supply lines $Z_1$ to $Z_m$ together with the protective insulating film 32. This will be described later in detail.

To use the EL display panel 1 as a bottom emission type, i.e., to use the insulating substrate 2 as the display screen, transparent materials are used for the gate insulating film 31, protective insulating film 32, and planarization film 33.

A plurality of long trenches 34 (FIG. 8) running in the horizontal direction along the supply lines $Z_1$ to $Z_m$ are formed in the protective insulating film 32 and planarization film 33 while overlapping the supply lines $Z_1$ to $Z_m$. Both insulating film 32, 33 are divided into rectangles running in the horizontal direction by two trenches 34 adjacent in the vertical direction. The feed interconnections 90 are buried in the trenches 34 so that the feed interconnections 90 are electrically connected to the supply lines $Z_1$ to $Z_m$. The feed interconnections 90 are formed by electroplating and are therefore much thicker than the signal lines $Y_1$ to $Y_n$, scan lines $X_1$ to $X_m$, supply lines $Z_1$ to $Z_m$, and the gates, sources, and drains of the transistors 21 to 23. More specifically, the thickness height of the feed interconnection 90 almost equals the total thickness or height of the protective insulating film 32 and planarization film 33. The feed interconnection 90 is made of gold, nickel, or a layered body thereof.

The layered structure from the insulating substrate 2 to the planarization film 33 is called a transistor array substrate 50. In the transistor array substrate 50, assemblies each having the switch transistor 21, holding transistor 22, and driving transistor 23 are arrayed in a matrix when viewed from the upper side.

The layer structure formed on the upper surface of the transistor array substrate 50 will be described next. The plurality of pixel electrodes 20a are arrayed in a matrix on the surface of the transistor array substrate 50, i.e., the upper surface of the planarization film 33. A plurality of contact holes 95 are formed in the planarization film 33 and protective insulating film 32 while overlapping the pixel electrodes 20a and the upper electrodes 24B of the capacitors 24. Conductive pads are buried in the contact holes 95. Hence, the pixel electrode 20a is electrically connected to the upper electrode 24B of the capacitor 24, the drain 21d of the switch transistor 21, and the source 23s of the driving transistor 23 through the contact hole 95 formed through the planarization film 33 and protective insulating film 32. The conductive pad in the contact hole 95 is formed by electroplating.

The pixel electrode 20a is an electrode functioning as the anode of the organic EL element 20. More specifically, the work function of the pixel electrode 20a is preferably relatively high so that holes can efficiently be injected into the organic EL layer 20b (to be described later). In a bottom emission structure, the pixel electrode 20a has a transparency to visible light. As the pixel electrode 20a, for example, a metal oxide containing, e.g., indium tin oxide (ITO), indium zinc oxide, indium oxide ($In_2O_3$), tin oxide ($SnO_3$), zinc oxide (ZnO), or cadmium tin oxide (CTO) as the major component can be used.

To use the EL display panel 1 as a top emission type, i.e., to use the opposite side of the insulating substrate 2 as the display screen, a reflecting film having conductivity and high visible light reflectance is preferably formed between the pixel electrode 20a and the planarization film 33.

The pixel electrodes 20a are formed, using photolithography and etching, by patterning a conductive film (a transparent conductive film for a bottom emission type) formed on the entire surface of the planarization film 33. On the feed interconnections 90 between the pixel electrodes 20a adjacent in the vertical direction, conductive lines 51 electrically connected to the feed interconnections 90 along them are patterned on alternate columns of the pixel electrodes 20a. The conductive lines 51 are patterned together with the pixel electrodes 20a by etching a conductive film as the prospective pixel electrodes 20a. The width of each conductive line 51 is so larger than that of the feed interconnection 90 under it that the feed interconnection 90 is covered not to expose and protected from the etchant of the conductive lines 51.

A mesh-shaped insulating film 52 made of insulating material such as silicon nitride is patterned between the pixel electrodes 20a. More specifically, the insulating film 52 is formed into a grid shape so that it runs in the row direction to cover the conductive lines 51 and not to expose them and also runs in the column direction as an underlayer of the common interconnections 91 (to be described later). The common interconnections 91 are formed along the column direction on the insulating film 52 between the pixel electrodes 20a adjacent in the horizontal direction.

Since the common interconnections 91 are formed by electroplating, they are much thicker than the signal lines $Y_1$ to $Y_n$, the scan lines $X_1$ to $X_m$, the supply lines $Z_1$ to $Z_m$, and the gates, sources, and drains of the transistors 21 to 23. The common interconnections 91 contain at least one of copper, aluminum, gold, and nickel.

A liquid repellent conductive film 55 having water repellency and/or oil repellency is formed on the upper surface of each common interconnection 91. The liquid repellent conductive films 55 are formed by reducing and eliminating hydrogen atoms (H) of the mercapto group (—SH) of triazyl-trithiol expressed by chemical formula (1), and oxidizing and adsorbing sulfur atoms (S) in the surfaces of the common interconnections 91.

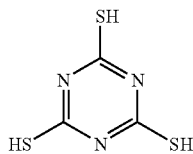

In the liquid repellent conductive film 55, triazyl-trithiol molecules are formed very thin on the surface of the common interconnection 91. For this reason, the liquid repellent conductive film 55 has a very low resistance in the direction of thickness and rarely has insulating properties. To make the water repellency and/or oil repellency more effective, a triazinethiol derivative in which an alkyl fluoride group substitute for one or two mercapto groups of triazyl-trithiol may be used in place of triazyl-trithiol. Such a triazyl compound can selectively be coated and bonded to a metal like the common interconnection 91. More specifically, an aqueous solution of 6-dimethylamino-1,3,5-triazine-2, and 4-dithiol-sodium salt is prepared at a concentration of $10^{-3}$ mol/L. When the common interconnection 91 is dipped in the aqueous solution at a liquid temperature of 26° C. for a dipping time of 30 min, the liquid repellent conductive film 55 having a thickness of about 0.7 nm is formed on the surface of the common interconnection 91 (the thickness is a measured value by ellipsometer). Alternatively, an aqueous solution of 6-didodecylamino-1,3,5-triazine-2, and 4-dithiol-sodium salt is prepared at a concentration of $10^{-3}$ mol/L. When the common interconnection 91 is dipped in the aqueous solution at a liquid temperature of 46° C. for a dipping time of 30 min, the liquid repellent conductive film 55 having a thickness of about 1.8 nm is formed on the surface of the common interconnection 91 (the thickness is a measured value by ellipsometer).

Alternatively, an aqueous solution of sodium hydroxide and a triazinethiol derivative (e.g., expressed by the chemical formula below) using pure water as the solvent may be applied to the common interconnection 91 to coat it with the triazinethiol derivative. For this solution, the concentration of the triazinethiol derivative is set to $2.0 \times 10^{-3}$ mol/L, and that of sodium hydroxide is set to $2.0 \times 10^{-3}$ mol/L.

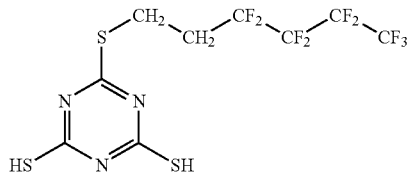

As described above, the fluorine-based triazinethiol compound in which at least part of hydrogen of an alkyl group is substituted with a fluorine group exhibits stronger liquid repellency than a triazinethiol compound containing no fluorine.

The organic EL layer 20b of the organic EL element 20 is formed on the pixel electrode 20a. The organic EL layer 20b is a light-emitting layer of broad sense. The organic EL layer 20b contains a light-emitting material (phosphor) as an organic compound. The organic EL layer 20b has a two-layer structure in which a hole transport layer and a light-emitting layer of narrow sense are formed sequentially on the pixel electrode 20a. The hole transport layer is made of PEDOT (polythiophene) as a conductive polymer and PSS (polystyrene sulfonate) as a dopant. The light-emitting layer of narrow sense is made of a polyfluorene-based light-emitting material.

The organic EL layer 20b is formed by wet coating (e.g., ink-jet method) after coating of the liquid repellent conductive film 55. In this case, an organic compound-containing solution containing an organic compound as the prospective organic EL layer 20b is applied to the pixel electrode 20a. The liquid level of the organic compound-containing solution is higher than the top of the insulating film 52. The thick common interconnection 91 whose top is much higher than that of the insulating film 52 is provided between the pixel electrodes 20a adjacent in the horizontal direction. The common interconnection 91 prevents the organic compound-containing solution applied to a pixel electrode 20a from leaking to the pixel electrodes 20a adjacent in the horizontal direction. In addition, the common interconnection 91 is coated with the liquid repellent conductive film 55 having water repellency and/or oil repellency, which repels the organic compound-containing solution applied to the pixel electrode 20a. The organic compound-containing solution applied to the pixel electrode 20a is never deposited excessively thick near the edge of the insulating line 52 as compared to the center of the pixel electrode 20a. Hence, the organic EL layer 20b formed by drying the organic compound-containing solution can have a uniform thickness.

Figure 12:
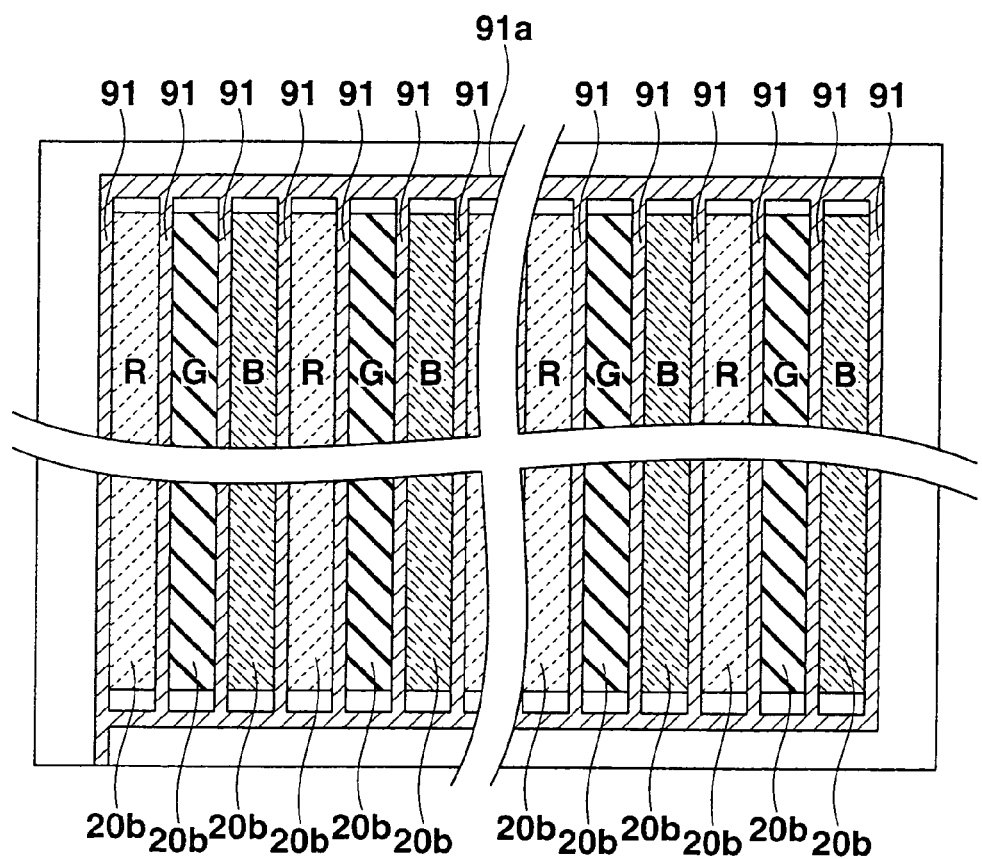
FIG. 12 is a schematic plan view showing the layout of an organic EL layer of the EL display panel.

When the organic EL layer 20b is formed between the common interconnections 91 in the above-described way, a stripe structure in which a region R where the organic EL layer 20b to emit red light is formed, a region G where the organic EL layer 20b to emit green light is formed, and a region B where the organic EL layer 20b to emit blue light is formed are arrayed in this order, as shown in FIG. 12, is formed. A plurality of pixels in the same column emit light of the same color.

When viewed from the upper side, the applied organic compound-containing solution is uniformly distributed vertically in each column because its left and right sides are partitioned by the common interconnections 91. Hence, the plurality of organic EL layers 20b arrayed in the vertical direction have the same layer structure and emit light of the same color. The pixel electrode 20a and organic EL layer 20b need not always have a band shape long in the vertical direction. Alternately, they may be long in the horizontal direction.

The organic EL layer 20b need not always have the two-layer structure. A three-layer structure including a hole transport layer, a light-emitting layer of narrow sense, and an electron transport layer sequentially from the pixel electrode 20a may be employed. A single-layer structure including a light-emitting layer of narrow sense may be used. A layered structure having an electron or hole injection layer inserted between appropriate layers in one of the above layer structures may be employed. Any other layered structures can also be used.

A counter electrode 20c functioning as the cathode of the organic EL element 20 is formed on the organic EL layer 20b. The counter electrode 20c is a common electrode commonly formed on the entire surface for all pixels. The counter electrode 20c formed on the entire surface covers the common interconnections 91 while sandwiching the liquid repellent conductive film 55 between them. For this reason, the counter electrode 20c is electrically connected to the common interconnection 91, as shown in the circuit diagram of FIG. 2.

The counter electrode 20c is formed from a material having a work function lower than the pixel electrode 20a. The counter electrode 20c is preferably made of, e.g., a single substance selected from magnesium, calcium, lithium, barium, indium, and a rare earth metal, or an alloy containing at least one of these single substances. The counter electrode 20c may have a layered structure in which the layers of various kinds of materials described above are stacked, or a layered structure in which a metal layer hard to oxidize is deposited in addition to the layers of various kinds of materials described above to lower the sheet resistance. More specifically, a layered structure including a highly pure barium layer having a low work function and provided on the interface side contacting the organic EL layer 20b, and an aluminum layer provided to cover the barium layer, or a layered structure including a lithium layer on the lower side and an aluminum layer on the upper side can be used. In a top emission structure, the counter electrode 20c may be a transparent electrode having the above-described thin film with a low work function and a transparent conductive film made of, e.g., ITO on the thin film.

A sealing insulating film 56 is formed on the counter electrode 20c. The insulating film 56 is an inorganic or organic film provided to cover the entire counter electrode 20c to prevent its degradation.

Conventionally, in an EL display panel having a top emission structure, at least part of the counter electrode 20c is formed as a transparent electrode made of, e.g., a metal oxide having a sufficiently high resistance value. The sheet resistance cannot be sufficient low unless the material is sufficiently thick. When the material is thick, the transmission of the organic EL element inevitably decreases. The larger the screen becomes, the harder a uniform potential is obtained in a plane. Hence, the display characteristic degrades.

In this embodiment, however, the plurality of common interconnections 91 with a low resistance are provided to obtain a sufficient thickness in the vertical direction. Hence, the sheet resistance value of the entire cathode electrodes of the organic EL elements 20 can be decreased together with the counter electrode 20c so that a sufficient large current can be supplied uniformly in a plane. In this structure, the common interconnections 91 reduce the sheet resistance of the cathode electrode. For this reason, the transmittance can be increased by forming the counter electrode 20c thin. In a top emission structure, the pixel electrode 20a may be made of a reflecting material.

[Manufacturing Method of Transistor Array Substrate and EL Display Panel]

A method of manufacturing the transistor array substrate 50 and EL display panel 1 will be described.

A gate layer is formed on the entire surface of the insulating substrate 2 by vapor deposition such as CVD, PVD, or sputtering. The gate layer is sequentially subjected to photolithography and etching to pattern the gates $21g$, $22g$, and $23g$ and the electrodes 24A of the pixel circuits $P_{1,1}$ to $P_{m,n}$ and the signal lines $Y_1$ to $Y_n$.

The gate insulating film 31 is formed on the entire surface by vapor deposition. The contact holes 92 to 94 of the pixel circuits $P_{1,1}$ to $P_{m,n}$ are formed through the gate insulating film 31 by photolithography and etching.

Vapor deposition, photolithography, and etching are sequentially executed to pattern the semiconductor films $21c$, $22c$, and $23c$ of the pixel circuits $P_{1,1}$ to $P_{m,n}$. Vapor deposition, photolithography, and etching are sequentially executed to pattern the channel protective films $21p$, $22p$, and $23p$ of the pixel circuits $P_{1,1}$ to $P_{m,n}$. Vapor deposition, photolithography, and etching are sequentially executed to pattern the impurity-doped semiconductor films $21a$, $22a$, $23a$ and impurity-doped semiconductor films $21b$, $22b$, and $23b$ of the pixel circuits $P_{1,1}$ to $P_{m,n}$.

A drain layer is formed on the entire surface of the gate insulating film 31 by vapor deposition. The contact holes 92 to 94 of the pixel circuits $P_{1,1}$ to $P_{m,n}$ are filled with parts of the drain layer.

The drain layer is sequentially subjected to photolithography and etching to pattern the drains $21d$, $22d$, and $23d$, the sources $21s$, $22s$, and $23s$, and the electrodes 24B of the pixel circuits $P_{1,1}$ to $P_{m,n}$, the scan lines $X_1$ to $X_m$, and the supply lines $Z_1$ to $Z_m$.

The protective insulating film 32 is formed on the entire surface by vapor deposition. A resin is applied onto the entire protective insulating film 32 and dried to form the planarization film 33 on the entire surface.

The contact holes 95 of the pixel circuits $P_{1,1}$ to $P_{m,n}$ are formed through the protective insulating film 32 and planarization film 33. The trenches 34 are formed in the protective insulating film 32 and planarization film 33 at positions overlapping the supply lines $Z_1$ to $Z_m$.

Electroplating is executed by applying a voltage to the supply lines $Z_1$ to $Z_m$ and the electrodes 24B to grow the feed interconnections 90 in the trenches 34 and also grow conductive pads in the contact holes 95. With this process, the feed interconnections 90 are formed on the supply lines $Z_1$ to $Z_m$ in the trenches 34, and the conductive pads are formed on the electrodes 24B in the contact holes 95.

In this way, the transistor array substrate 50 is completed.

A transparent conductive film is formed on the entire surface of the transistor array substrate 50 by vapor deposition. The transparent conductive film is sequentially subjected to photolithography and etching to pattern the pixel electrodes 20a of the pixel circuits $P_{1,1}$ to $P_{m,n}$ and the conductive lines 51.

An insulating film is formed on the entire surface by vapor deposition. On the insulating film, the common interconnections 91 are grown by electroplating between the pixel electrodes 20a adjacent in the horizontal direction.

A triazyl-trithiol solution is applied on the entire surface, or the panel is dipped in a triazyl-trithiol solution to selectively form the liquid repellent conductive film 55 on the surfaces of the common interconnections 91. The liquid repellent conductive films 55 are formed on the surfaces of the common interconnections 91 because of the properties of triazyl-trithiol. No liquid repellent conductive film is formed on the surface of the insulating film.

The insulating film is sequentially subjected to photolithography and etching to pattern the insulating film into the insulating film 52 having openings in a matrix. With this process, the pixel electrodes 20a are exposed.

By wet coating, the organic EL layers 20b are patterned. The thick common interconnections 91 are provided between the pixel electrodes 20a adjacent in the horizontal direction. In addition, the common interconnections 91 are coated with the liquid repellent conductive films 55 having water repellency and/or oil repellency. Hence, the organic compound-containing solution applied to each pixel electrode 20a does not leak to the adjacent pixel electrodes 20a. The organic compound-containing solution applied to each pixel electrode 20a is not thick around it because of the water repellency and/or oil repellency of the liquid repellent conductive film 55. Hence, the organic EL layer 20b can be formed in a uniform thickness.

The counter electrode 20c is formed on the entire surface by vapor deposition. The sealing insulating film 56 is formed on the entire surface by vapor deposition.

In this way, the EL display panel 1 is completed.

[EL Display Panel Driving Method]

Figure 13:
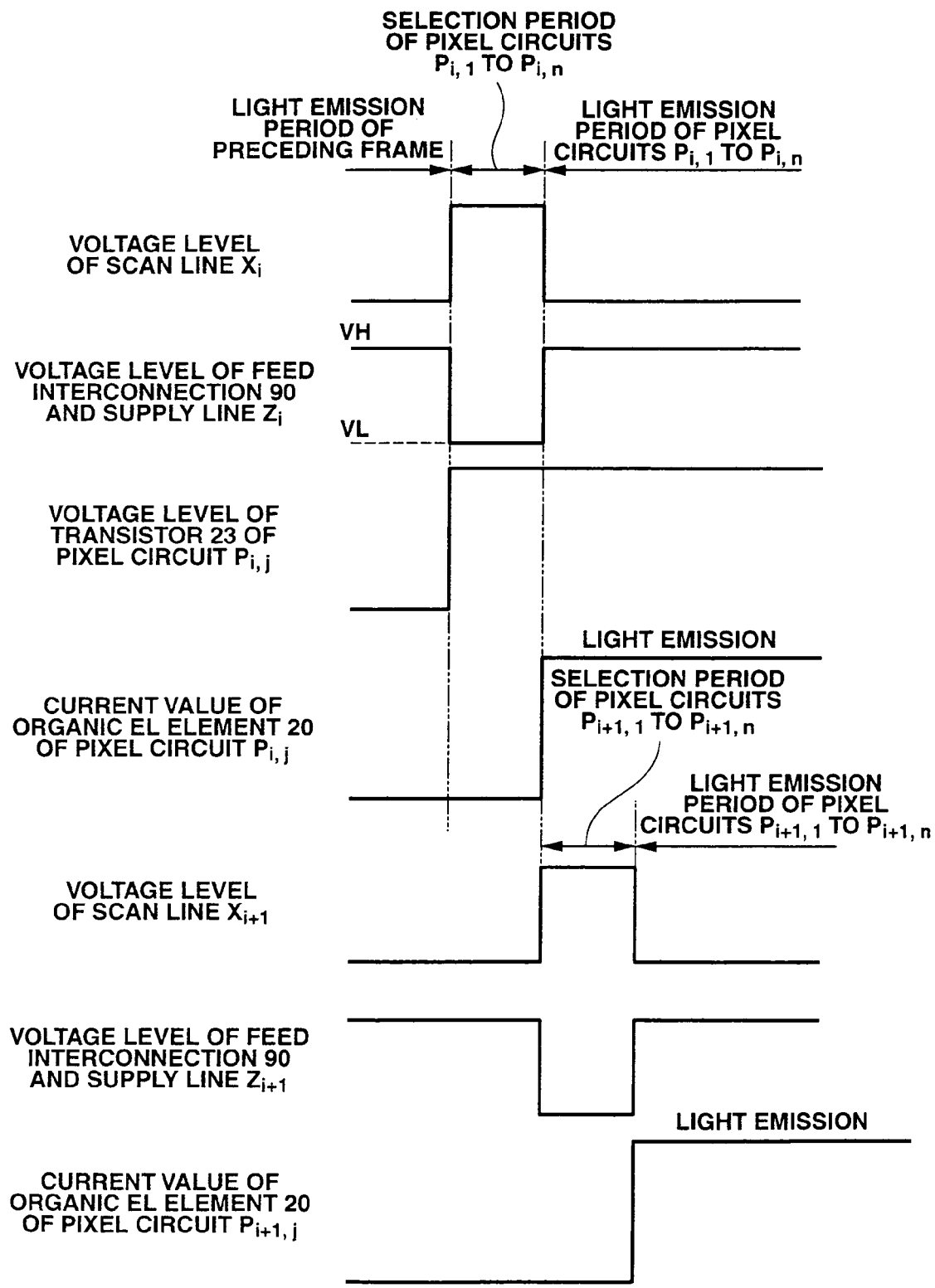
FIG. 13 is a timing chart for explaining a driving method of the EL display panel.

The EL display panel 1 can be driven by the active matrix method in the following way. As shown in FIG. 13, a select driver connected to the scan lines $X_1$ to $X_m$ sequentially outputs a shift pulse of high level to the scan lines $X_1$ to $X_m$ in this order (the scan line $X_1$ next to the scan line $X_m$), thereby sequentially selecting the scan lines $X_1$ to $X_m$. A feed driver is connected to the feed interconnections 90. The feed driver applies the write feed voltage VL to supply a write current to the driving transistors 23 connected to the supply lines $Z_1$ to $Z_m$ through the feed interconnections 90 during a selection period. The feed driver applies the driving feed voltage VH to supply a driving current to the organic EL elements 20 through the driving transistors 23 during a light emission period. The feed driver sequentially outputs the write feed voltage VL of low level (lower than the voltage of the counter electrode of the organic EL elements 20) to the supply lines $Z_1$ to $Z_m$ in this order (the supply line $Z_1$ next to the supply line $Z_m$) in synchronism with the select driver, thereby sequentially selecting the supply lines $Z_1$ to $Z_m$. While the select driver is selecting the scan lines $X_1$ to $X_m$, a data driver supplies a write current (current signal) to all the signal lines $Y_1$ to $Y_n$ through the source-to-drain paths of the driving transistors 23 of a predetermined row. At this time, the feed driver also outputs the write feed voltage VL of low level from both the interconnection terminals 90b and 90c to the feed interconnections 90 connected to the supply lines $Z_1$ to $Z_m$.

The counter electrode 20c and common interconnections 91 are connected to an external device through the interconnection terminals 91c and held at the predetermined common potential Vcom (e.g., ground=0V).

During the selection period of the scan line $X_i$, the shift pulse of high level is output to the scan line $X_i$ of the ith row so that the switch transistor 21 and holding transistor 22 are turned on. In each selection period, the potential on the data driver side is equal to or lower than the write feed voltage VL output to the feed interconnections 90 and the supply lines $Z_1$ to $Z_m$. The write feed voltage VL is set to be equal to or lower than the common potential Vcom. At this time, no current flows from the organic EL elements 20 to the signal lines $Y_1$ to $Y_n$. As shown in FIG. 2, a write current (current signal) having a current value corresponding to the gray level is supplied from the data driver to the signal lines $Y_1$ to $Y_n$, as indicated by an arrow A. In the pixel circuit $P_{i,j}$, the write current (current signal) to the signal line $Y_j$ flows from the feed interconnection 90 and supply line $Z_i$ through the source-to-drain path of the driving transistor 23 and the source-to-drain path of the switch transistor 21. The current value of the current flowing through the source-to-drain path of the driving transistor 23 is uniquely controlled by the data driver. The data driver sets the current value of the write current in accordance with an externally input gray level. While the write current (current signal) is flowing, the voltage between the gate 23g and source 23s of the driving transistor 23 of each of pixel circuits $P_{i,1}$ to $P_{i,n}$ of the ith row is forcibly set in accordance with the current value of the write current (current signal) flowing to the signal lines $Y_1$ to $Y_n$, i.e., the current value of the write current (current signal) flowing between the drain 23d and source 23s of the driving transistor 23 independently of the change over time in the Vg-Ids characteristic of the driving transistor 23. Charges with a magnitude corresponding to the level of this voltage are stored in the capacitor 24 so that the current value of the write current (current signal) is converted into the voltage level between the gate 23g and source 23s of the driving transistor 23. In the subsequent light emission period, the scan line $X_i$ changes to low level so that the switch transistor 21 and holding transistor 22 are turned off. The charges on the side of the lower electrode 24A of the capacitor 24 are confined by the holding transistor 22 in the OFF state, and a floating state is set. Hence, even when the voltage of the source 23s of the driving transistor 23 is modulated at the time of transition from the selection period to the light emission period, the potential difference between the gate 23g and source 23s of the driving transistor 23 is maintained. During the light emission period, the potential of the supply line $Z_i$ and the feed interconnection 90 connected to it equals the driving feed voltage VH which is higher than the potential Vcom of the counter electrode 20c of the organic EL element 20. Hence, a driving current flows from the supply line $Z_i$ and the feed interconnection 90 connected to it to the organic EL element 20 in the direction of arrow B through the driving transistor 23. Hence, the organic EL element 20 emits light. The current value of the driving current depends on the voltage between the gate 23g and source 23s of the driving transistor 23. For this reason, the current value of the driving current during the light emission period equals the current value of the write current (pull-out current) during the selection period.

Figure 14:
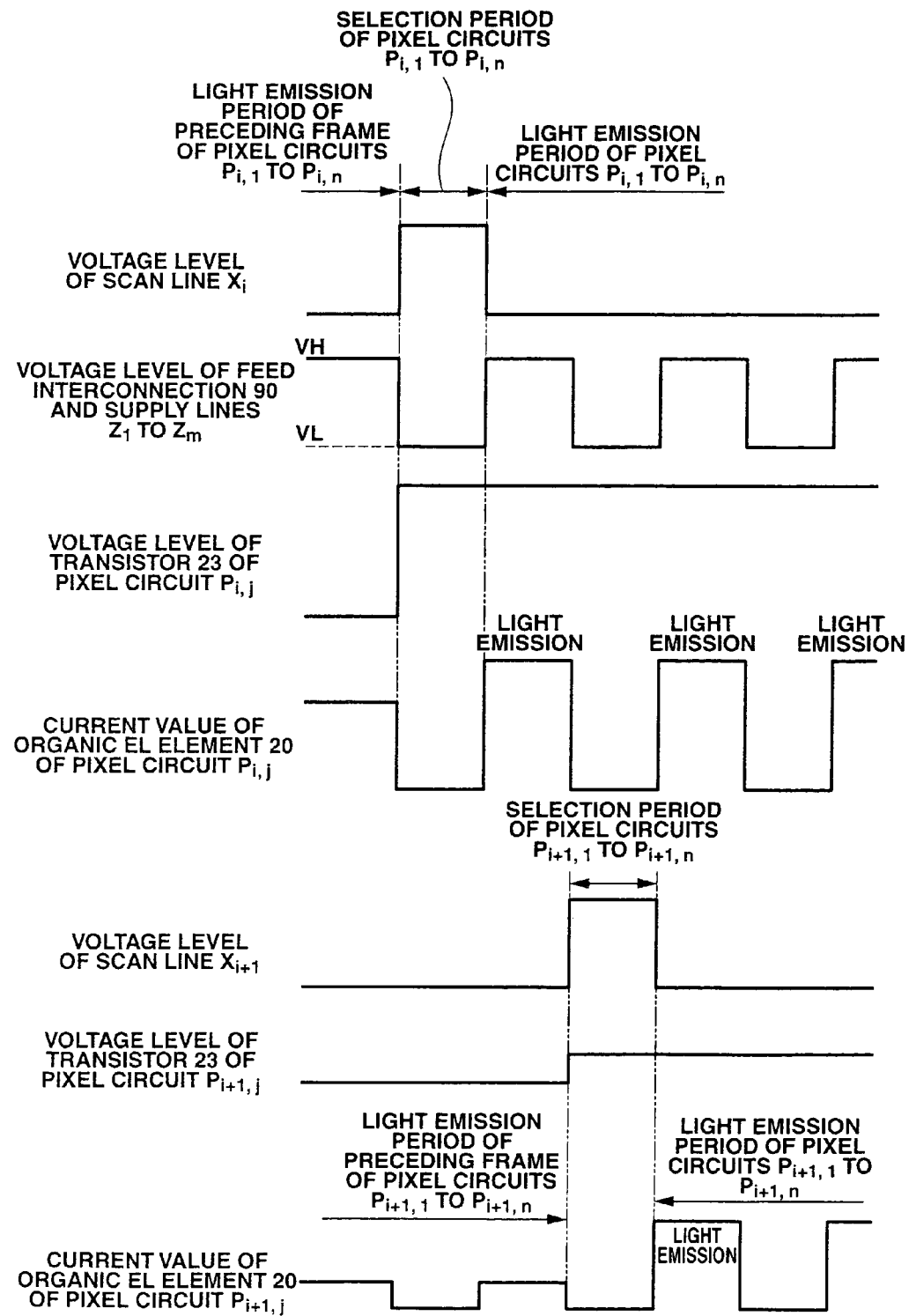
FIG. 14 is a timing chart for explaining another driving method of the EL display panel.

Another active matrix driving method of the EL display panel 1 is as follows. As shown in FIG. 14, an oscillation circuit outputs a clock signal to the feed interconnections 90 and supply lines $Z_1$ to $Z_m$. The select driver sequentially outputs a shift pulse of high level to the scan lines $X_1$ to $X_m$ in this order (the scan line $X_1$ next to the scan line $X_m$), thereby sequentially selecting the scan lines $X_1$ to $X_m$. While the select driver is outputting the shift pulse to one of the scan lines $X_1$ to $X_m$, the clock signal from the oscillation circuit changes to low level. When the select driver selects the scan lines $X_1$ to $X_m$, the data driver supplies a pull-out current (current signal) as the write current to all the signal lines $Y_1$ to $Y_n$ through the source-to-drain paths of the driving transistors 23. The counter electrode 20c and feed interconnections 90 are held at the predetermined common potential Vcom (e.g., ground=0V).

During the selection period of the scan line $X_i$, the shift pulse is output to the scan line $X_i$ of the ith row so that the switch transistor 21 and holding transistor 22 are turned on. In each selection period, the potential on the data driver side is equal to or lower than the clock signal output to the feed interconnections 90 and supply lines $Z_1$ to $Z_m$. The low level of the clock signal is set to be equal to or lower than the common potential Vcom. At this time, no current flows from the organic EL elements 20 to the signal lines $Y_1$ to $Y_n$. As shown in FIG. 2, a write current (pull-out current) having a current value corresponding to the gray level is supplied from the data driver to the signal lines $Y_1$ to $Y_n$, as indicated by the arrow A. In the pixel circuit $P_{i,j}$, the write current (pull-out current) to the signal line $Y_j$ flows from the feed interconnection 90 and supply line $Z_i$ through the source-to-drain path of the driving transistor 23 and the source-to-drain path of the switch transistor 21. The current value of the current flowing through the source-to-drain path of the driving transistor 23 is uniquely controlled by the data driver. The data driver sets the current value of the write current (pull-out current) in accordance with an externally input gray level. While the write current (pull-out current) is flowing, the voltage between the gate 23g and source 23s of the driving transistor 23 of each of the pixel circuits $P_{i,1}$ to $P_{i,n}$ of the ith row is forcibly set in accordance with the current value of the write current (pull-out current) flowing to the signal lines $Y_1$ to $Y_n$, i.e., the current value of the write current (pull-out current) flowing between the drain 23d and source 23s of the driving transistor 23 independently of the change over time in the Vg-Ids characteristic of the driving transistor 23. Charges with a magnitude corresponding to the level of this voltage are stored in the capacitor 24 so that the current value of the write current (pull-out current) is converted into the voltage level between the gate 23g and source 23s of the driving transistor 23. In the subsequent light emission period, the scan line $X_i$ changes to low level so that the switch transistor 21 and holding transistor 22 are turned off. The charges on the side of the lower electrode 24A of the capacitor 24 are confined by the holding transistor 22 in the OFF state, and a floating state is set. Hence, even when the voltage of the source 23s of the driving transistor 23 is modulated at the time of transition from the selection period to the light emission period, the potential difference between the gate 23g and source 23s of the driving transistor 23 is maintained. Of the selection period, during a period in which no row is selected, i.e., the clock signal is at high level, and the potential of the feed interconnection 90 and supply line $Z_i$ is higher than the potential Vcom of the counter electrode 20c of the organic EL element 20 and the feed interconnection 90, the driving current flows from the feed interconnection 90 and supply line $Z_i$ with a higher potential to the organic EL element 20 through the source-to-drain path of the driving transistor 23 in the direction of arrow B. Hence, the organic EL element emits light. The current value of the driving current depends on the voltage between the gate 23g and source 23s of the driving transistor 23. For this reason, the current value of the driving current during the light emission period equals the current value of the write current (pull-out current) during the selection period. Of the selection period, during a period in which any row is selected, i.e., the clock signal is at low level, the potential of the feed interconnection 90 and supply line $Z_i$ is equal to or lower than the potential Vcom of the counter electrode 20c and feed interconnection 90. Hence, no driving current flows to the organic EL element 20, and thus no light emission occurs.

In either driving method as described above, the switch transistor 21 functions to turn on (selection period) and off (light emission period) of the current between the signal line $Y_j$ and the source 23s of the driving transistor 23. The holding transistor 22 functions to make it possible to supply the current between the source 23s and drain 23d of the driving transistor 23 during the selection period and hold the voltage applied to the gate 23g of the driving transistor 23 during the light emission period. The driving transistor 23 functions to drive the organic EL element 20 by supplying a current having a magnitude corresponding to the gray level to the organic EL element 20.

As described above, the magnitude of the current flowing to the feed interconnection 90 equals the sum of the magnitudes of driving currents flowing to the n organic EL elements 20 connected to the scan line $X_i$ of one column. When a selection period to do moving image driving using pixels for VGA or more is set, the parasitic capacitance of the feed interconnection 90 increases. The resistance of a thin film such as the gate or the source/drain of a thin-film transistor is so high that the write current (i.e. driving current) cannot be supplied to the n organic EL elements 20. In this embodiment, the feed interconnections 90 are formed from a conductive layer different from the gates, sources and drains of thin-film transistors of the pixel circuits $P_{1,1}$ to $P_{m,n}$. For this reason, the voltage drop by the feed interconnections 90 is small. Even in a short selection period, the write current (pull-out current) can sufficiently be supplied without any delay. Since the resistance of the feed interconnection 90 is lowered by thickening it, the feed interconnection 90 can be made narrow. In a bottom emission structure, the decrease in pixel opening ratio can be minimized.

Similarly, the magnitude of the driving current flowing to the common interconnection 91 during the light emission period equals that of the write current (pull-out current) flowing to the feed interconnection 90 during the selection period. Since a conductive layer different from the gates, sources and drains of thin-film transistors of the pixel circuits $P_{1,1}$ to $P_{m,n}$ is connected to the counter electrode 20c, the common interconnection 91 can be made thick, and its resistance can be lowered. In addition, even when the counter electrode 20c itself becomes thin and increases its resistance, the voltage of the counter electrode 20c can be uniformed in the plane. Hence, even if the same potential is applied to all the pixel electrodes 20a, the light emission intensities of the organic EL layers 20b almost equal, and the light emission intensity in the plane can be uniformed.

When the EL display panel 1 is used as a top emission type, the counter electrode 20c can be made thinner. Hence, light emitted from the organic EL layer 20b hardly attenuates while passing through the counter electrode 20c. Additionally, since the common interconnection 91 are provided between the pixel electrodes 20a adjacent in the horizontal direction when viewed from the upper side, the decrease in pixel opening ratio can be minimized.

The supply lines $Z_1$ to $Z_m$ are the upper layers of the signal lines $Y_1$ to $Y_n$. In the manufacturing process of the transistor array substrate 50 and EL display panel 1, when the structure is dipped in a plating solution while a voltage is applied to the supply lines $Z_1$ to $Z_m$ by using them as an underlayer, the feed interconnections 90 can be grown on the supply lines $Z_1$ to $Z_m$.

Figure 15:
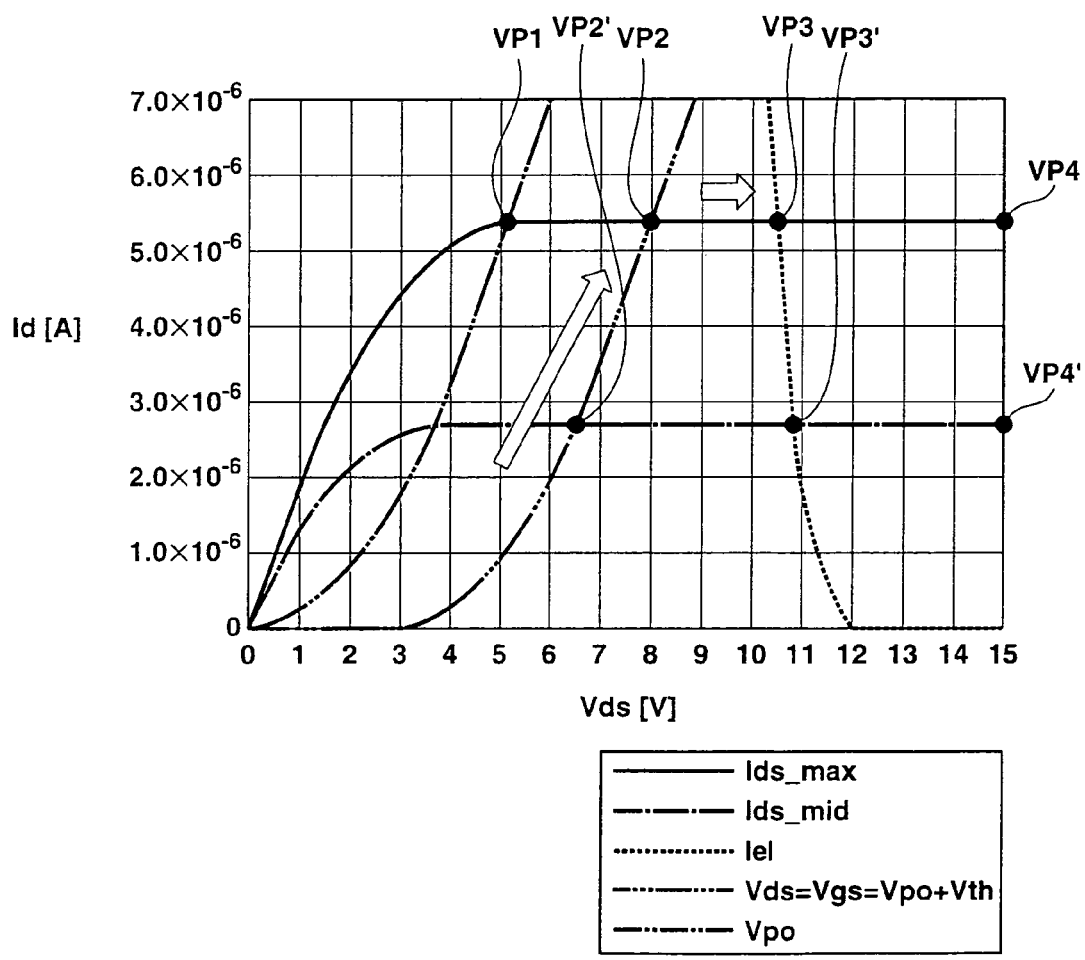
FIG. 15 is a graph showing the current vs. voltage characteristic of the driving transistor and organic EL element of each pixel circuit.

When the EL display panel 1 has pixels corresponding to WXGA (768×1366), the desired width and sectional area of the feed interconnection 90 and common interconnection 91 are defined. FIG. 15 is a graph showing the current vs. voltage characteristic of the driving transistor 23 and organic EL element 20 of each of the pixel circuits $P_{1,1}$ to $P_{m,n}$.

Referring to FIG. 15, the ordinate represents the current value of the write current flowing between the source 23s and drain 23d of one driving transistor 23 or the current value of the driving current flowing between the anode and cathode of one organic EL element 20. The abscissa represents the voltage between the source 23s and drain 23d of one driving transistor 23 (also the voltage between the gate 23g and drain 23d of one driving transistor 23). Referring to FIG. 15, a solid line Ids max indicates a write current and driving current for the highest luminance gray level (brightest display). A one-dot dash line Ids mid indicates a write current and driving current for an intermediate highest luminance gray level between the highest luminance gray level and the lowest luminance gray level. A two-dots dash line Vpo indicates a threshold value between the unsaturation region (linear region) and the saturation region of the driving transistor 23, i.e., the pinch-off voltage. A three-dots dash line Vds indicates a write current flowing between the source 23s and drain 23d of the driving transistor 23. A broken line IEL indicates a driving current flowing between the anode and cathode of the organic EL element 20.

A voltage VP1 is the pinch-off voltage of the driving transistor 23 for the highest luminance gray level. A voltage VP2 is the source-to-drain voltage of the driving transistor 23 when a write current for the highest luminance gray level flows. A voltage VELmax (voltage VP4−voltage VP3) is the anode-to-cathode voltage when the organic EL element 20 emits light by a driving current of the highest luminance gray level, which has a current value equal to that of the write current for the highest luminance gray level. A voltage VP2' is the source-to-drain voltage of the driving transistor 23 when a write current for the intermediate luminance gray level flows. A voltage (voltage VP4'−voltage VP3') is the anode-to-cathode voltage when the organic EL element 20 emits light by a driving current of the intermediate luminance gray level, which has a current value equal to that of the write current for the intermediate luminance gray level.

To drive the driving transistor 23 and organic EL element 20 in the saturation region, a value VX obtained by subtracting (the voltage Vcom of the common interconnection 91 during the light emission period) from (the driving feed voltage VH of the feed interconnection 90 during the light emission period) satisfies $$VX = Vpo + Vth + Vm + VEL \quad (2)$$

where Vth (=VP2−VP1 for the highest luminance) is the threshold voltage of the driving transistor 23, VEL (=VEmax for the highest luminance) is the anode-to-cathode voltage of the organic EL element 20, and Vm is an allowable voltage which displaces in accordance with the gray level.

As is apparent from FIG. 15, the higher the luminance gray level is, the higher the voltage (Vpo+Vth) necessary between the source and drain of the transistor 23 is, and also, the higher the voltage VEL necessary between the anode and cathode of the organic EL element 20 is. Hence, the allowable voltage Vm becomes low as the luminance gray level becomes high. A minimum allowable voltage Vmin is VP3−VP2.

The organic EL element 20 generally degrades and increases its resistance over time no matter whether a low or high molecular weight EL material. It has been confirmed that the anode-to-cathode voltage after 10,000 hrs is about 1.4 to several times that in the initial state. That is, the voltage VEL rises along with the elapse of time even when the luminance gray level does not change. The operation is stable for a long time when the allowable voltage Vm in the initial driving state is as high as possible. Hence, the voltage VX is set such that the voltage VEL becomes 8V or more and, more preferably, 13V or more.

The allowable voltage Vm includes not only the increase amount of the resistance of the organic EL element 20 but also the voltage drop by the feed interconnection 90.

If the voltage drop is large because of the interconnection resistance of the feed interconnection 90, the power consumption of the EL display panel 1 considerably increases. Hence, the voltage drop of the feed interconnection 90 is especially preferably set to 1V or less. When the panel size of the EL display panel 1 is 32 inches, the current value of one organic EL element 20 for the maximum luminance gray level is set to about 5.4 μA to 6.8 μA. For a 40-inch panel, the current value is set to 8.5 μA to 11.0 μA.

A pixel width Wp as the row-direction length of one pixel, the number of pixels (1366) in the row direction, the extension portion from the feed interconnection 90 to the interconnection terminal 90b in the non-pixel region on the left side, and the extension portion from the feed interconnection 90 to the interconnection terminal 90c in the non-pixel region on the right side are taken into consideration. In this case, the total length of the feed interconnection 90 is 706.7 mm for the EL display panel 1 with a panel size of 32 inches or 895.2 mm for 40 inches. If a line width WL of the feed interconnection 90 and common interconnection 91 is large, the area of the organic EL layer 20b decreases structurally. In addition, the overlap parasitic capacitance to other interconnections is also generated, and the voltage drop becomes larger. To prevent this, the line width WL of the feed interconnection 90 and common interconnection 91 is preferably suppressed to ⅕ or less the pixel width Wp. In consideration of this, the line width WL of the feed interconnection 90 and common interconnection 91 is 34 μm or less for the EL display panel 1 with a panel size of 32 inches or 44 μm or less for 40 inches. A maximum thickness Hmax of the feed interconnection 90 and common interconnection 91 is 1.5 times the minimum process size (4 μm) of the transistors 21 to 23, i.e., 6 μm when the aspect ratio is taken into consideration. A maximum sectional area Smax of the feed interconnection 90 and common interconnection 91 is 204 μm² for 32 inches or 264 μm² for 40 inches.

Figure 16:
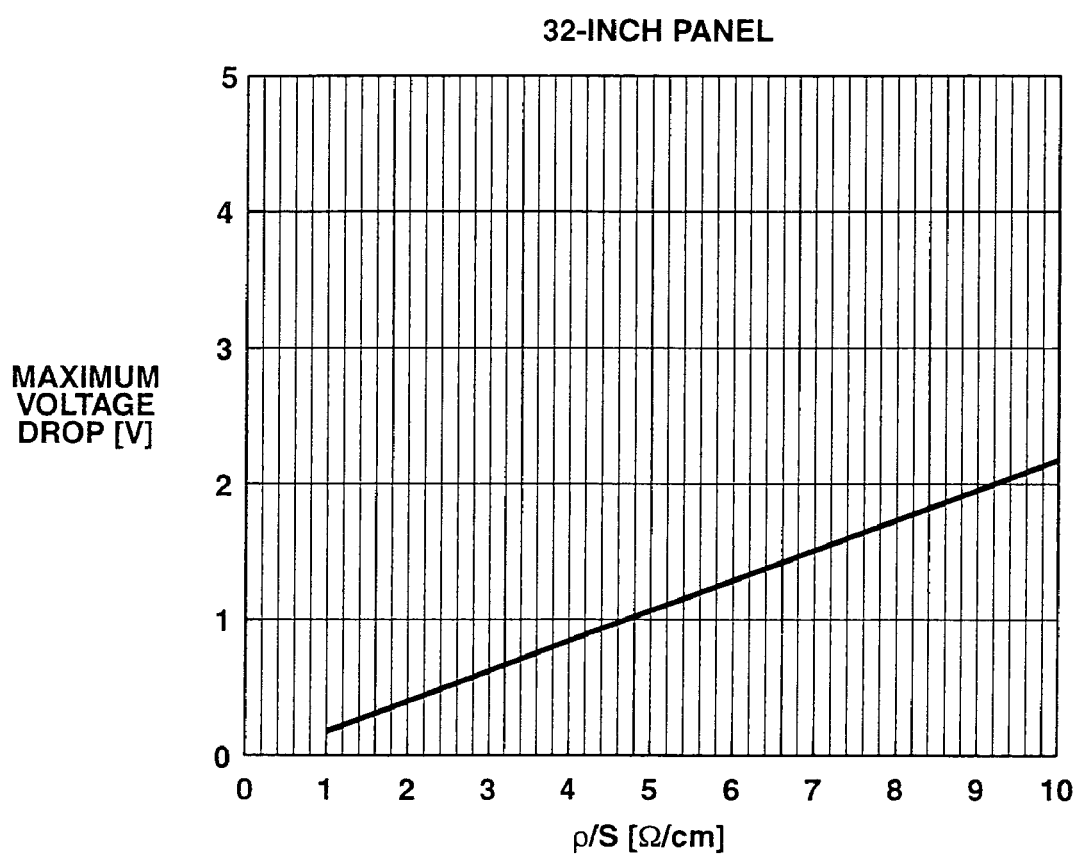
FIG. 16 is a graph showing the correlation between the maximum voltage drop and the interconnection resistivity ρ/sectional area S of the feed interconnection and common interconnection of a 32-inch EL display panel.
Figure 17:
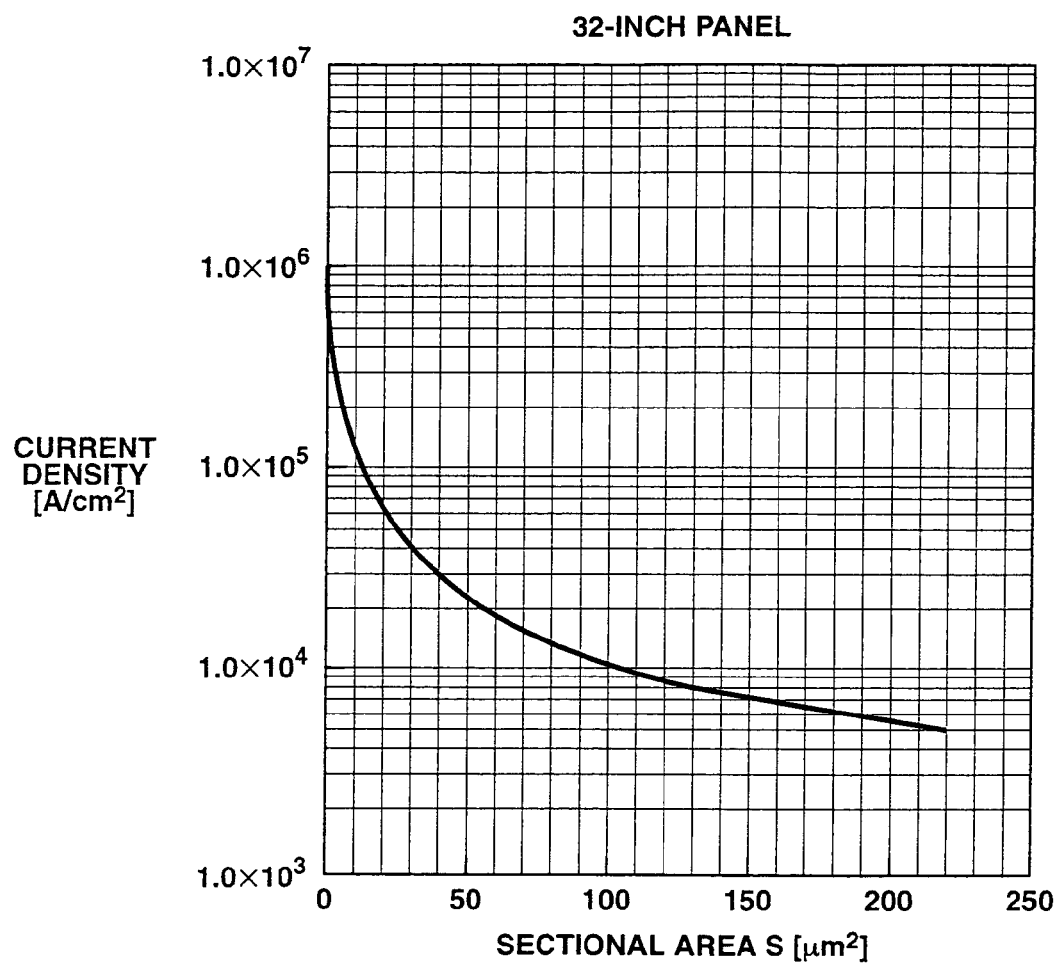
FIG. 17 is a graph showing the correlation between the sectional area and the current density of the feed interconnection and common interconnection of the 32-inch EL display panel.

To make the maximum voltage drop of the feed interconnection 90 and common interconnection 91 1V or less when the 32-inch EL display panel 1 is fully lighted to flow the maximum current, an interconnection resistivity ρ/sectional area S of the feed interconnection 90 and common interconnection 91 must be set to 4.7 Ω/cm or less, as shown in FIG. 16. FIG. 17 shows the correlation between the sectional area and the current density of the feed interconnection and common interconnection of the 32-inch EL display panel 1. The resistivity allowed when the above-described feed interconnection 90 and common interconnection 91 have the maximum sectional area Smax is 9.6 μΩcm for 32 inches or 6.4 μΩcm for 40 inches.

Figure 18:
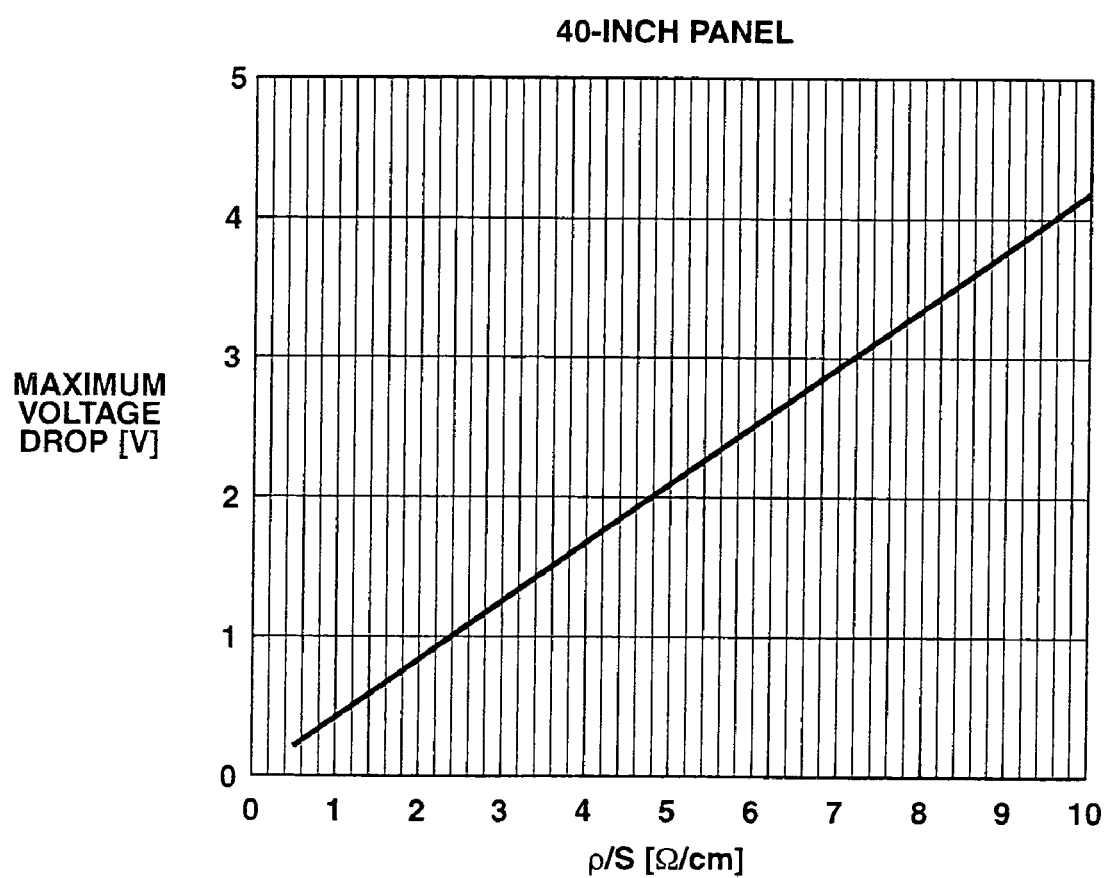
FIG. 18 is a graph showing the correlation between the maximum voltage drop and the interconnection resistivity ρ/sectional area S of the feed interconnection and common interconnection of a 40-inch EL display panel 1.
Figure 19:
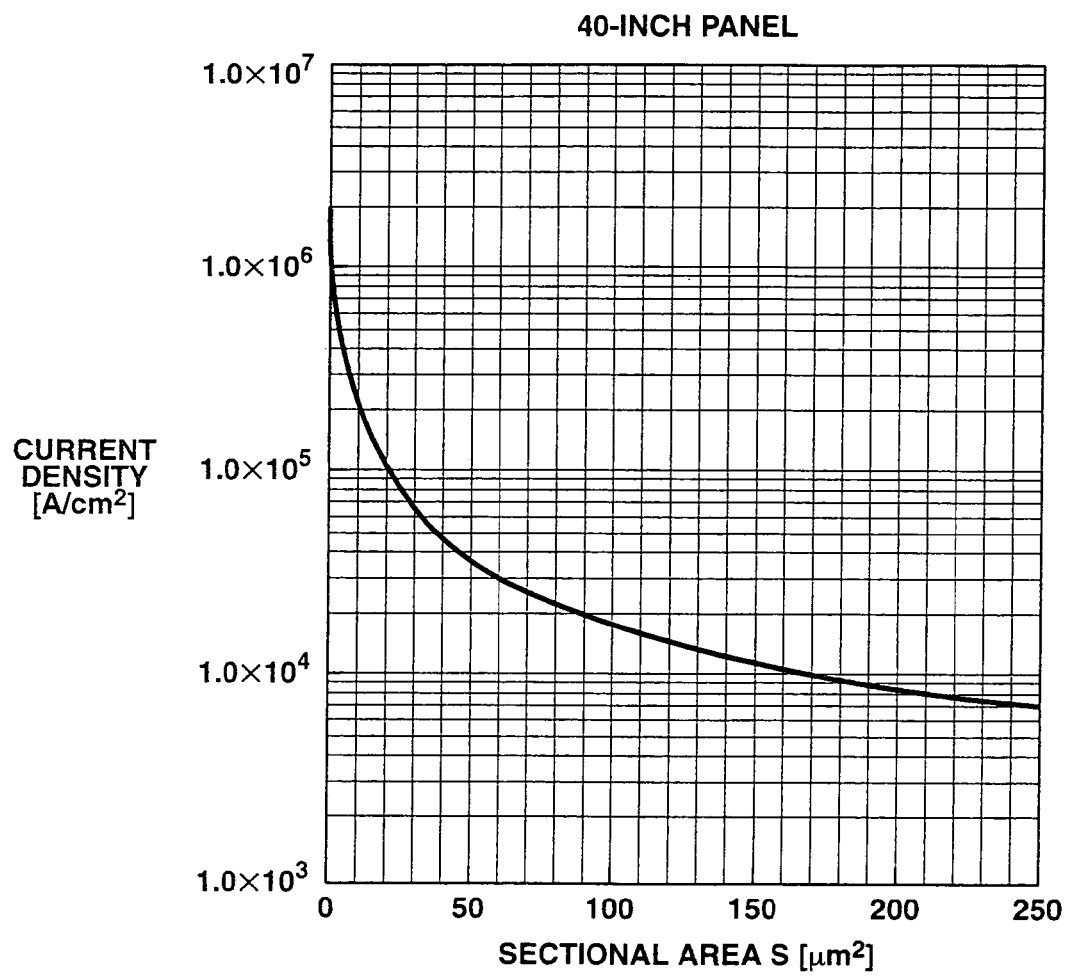
FIG. 19 is a graph showing the correlation between the sectional area and the current density of the feed interconnection and common interconnection of the 40-inch EL display panel.

To make the maximum voltage drop of the feed interconnection 90 and common interconnection 91 1V or less when the 40-inch EL display panel 1 is fully lighted to flow the maximum current, the interconnection resistivity ρ/sectional area S of the feed interconnection 90 and common interconnection 91 must be set to 2.4 Ω/cm or less, as shown in FIG. 18. FIG. 19 shows the correlation between the sectional area and the current density of the feed interconnection and common interconnection of the 40-inch EL display panel 1.

A median time to failure MTF at which the EL display panel stops operation due to a failure in the feed interconnection 90 and common interconnection 91 satisfies $$MTF = A\exp(Ea/K_bT)/\rho J^2 \qquad (3)$$

where Ea is an activation energy, $K_bT=8.617\times10^{-5}$ eV, $\rho$ is the resistivity of the feed interconnection 90 and common interconnection 91, and J is a current density.

The median time to failure MTF of the feed interconnection 90 and common interconnection 91 is determined by an increase in resistivity and electromigration. When the feed interconnection 90 and common interconnection 91 are set to an Al-based material (Al single substance or an alloy such as AlTi or AlNd), and calculation is done on trial for MTF of 10,000 hrs and an operation temperature of 85° C., the current density J must be $2.1\times10^4$ A/cm$^2$ or less. When the feed interconnection 90 and common interconnection 91 are set to Cu, the current density J must be $2.8\times10^6$ A/cm$^2$ or less. It is assumed that materials except Al in an Al alloy have a resistivity lower than Al.

In consideration of these, in the 32-inch EL display panel 1, the sectional area S of the Al-based feed interconnection 90 and common interconnection 91 must be 57 μm$^2$ or more to prevent any failure in them in the full lighting state for 10,000 hrs, as is apparent from FIG. 17. The sectional area S of the feed interconnection 90 and common interconnection 91 made of Cu must be 0.43 μm$^2$ or more, as is apparent from FIG. 17.

In the 40-inch EL display panel 1, the sectional area S of the Al-based feed interconnection 90 and common interconnection 91 must be 92 μm$^2$ or more to prevent any failure in them in the full lighting state for 10,000 hrs, as is apparent from FIG. 19. The sectional area S of the feed interconnection 90 and common interconnection 91 made of Cu must be 0.69 μm$^2$ or more, as is apparent from FIG. 19.

In the 32-inch EL display panel 1, the interconnection resistivity ρ/sectional area S of the Al-based feed interconnection 90 and common interconnection 91 is 4.7 Ω/cm or less, as described above, assuming that the resistivity of the Al-based material is 4.0 μΩcm. Hence, a minimum sectional area 5 min is 85.1 μm$^2$. Since the line width WL of the feed interconnection 90 and common interconnection 91 is 34 μm or less, as described above, a minimum thickness Hmin of the feed interconnection 90 and common interconnection 91 is 2.50 μm.

In the 40-inch EL display panel 1, the interconnection resistivity ρ/sectional area S of the Al-based feed interconnection 90 and common interconnection 91 is 2.4 Ω/cm or less, as described above. Hence, the minimum sectional area 5 min is 167 μm$^2$. Since the line width WL of the feed interconnection 90 and common interconnection 91 is 44 μm or less, as described above, the minimum thickness Hmin of the feed interconnection 90 and common interconnection 91 is 3.80 μm.

In the 32-inch EL display panel 1, the interconnection resistivity ρ/sectional area S of the feed interconnection 90 and common interconnection 91 made of Cu is 4.7 Ω/cm or less, as described above, assuming that the resistivity of Cu is 2.10 μΩcm. Hence, the minimum sectional area 5 min is 44.7 μm$^2$. Since the line width WL of the feed interconnection 90 and common interconnection 91 is 34 μm or less, as described above, the minimum thickness Hmin of the feed interconnection 90 and common interconnection 91 is 1.31 μm.

In the 40-inch EL display panel 1, the interconnection resistivity ρ/sectional area S of the feed interconnection 90 and common interconnection 91 made of Cu is 2.4 Ω/cm or less, as described above. Hence, the minimum sectional area 5 min is 87.5 μm$^2$. Since the line width WL of the feed interconnection 90 and common interconnection 91 is 44 μm or less, as described above, the minimum thickness Hmin of the feed interconnection 90 and common interconnection 91 is 1.99 μm.

Hence, to cause the EL display panel 1 to operate normally at a low power consumption, the voltage drop in the feed interconnection 90 and common interconnection 91 is preferably 1V or less. To ensure such a condition, in a 32-inch panel in which the feed interconnection 90 and common interconnection 91 are made of an Al-based material, a thickness H is 2.50 to 6.0 μm, the width WL is 14.1 to 34.0 μm, and the resistivity is 4.0 to 9.6 μΩcm. In a 40-inch panel in which the feed interconnection 90 and common interconnection 91 are made of an Al-based material, the thickness H is 3.8 to 6.0 μm, the width WL is 27.8 to 44.0 μm, and the resistivity is 4.0 to 9.6 μΩcm.

In general, for the Al-based feed interconnection 90 and common interconnection 91, the thickness H is 2.5 to 6.0 μm, the width WL is 14.1 to 44.0 μm, and the resistivity is 4.0 to 9.6 μΩcm.

In a 32-inch panel in which the feed interconnection 90 and common interconnection 91 are made of Cu, the thickness H is 1.31 to 6.00 μm, the width WL is 7.45 to 34.0 μm, and the resistivity is 2.1 to 9.6 μΩcm. In a 40-inch panel in which the feed interconnection 90 and common interconnection 91 are made of Cu, the thickness H is 1.99 to 6.00 μm, the width WL is 14.6 to 44.0 μm, and the resistivity is 2.1 to 9.6 μΩcm.

In general, for the feed interconnection 90 and common interconnection 91 made of Cu, the thickness H is 1.31 to 6.00 μm, the width WL is 7.45 to 44.00 μm, and the resistivity is 2.1 to 9.6 μΩcm.

Hence, when an Al-based material or Cu is used for the feed interconnection 90 and common interconnection 91, the feed interconnection 90 and common interconnection 91 of the EL display panel 1 have the thickness H of 1.31 to 6.00 μm, the width WL of 7.45 to 44.00 μm, and the resistivity of 2.1 to 9.6 μΩcm.

Second Embodiment

[Overall Arrangement of EL Display Panel]

Figure 20:
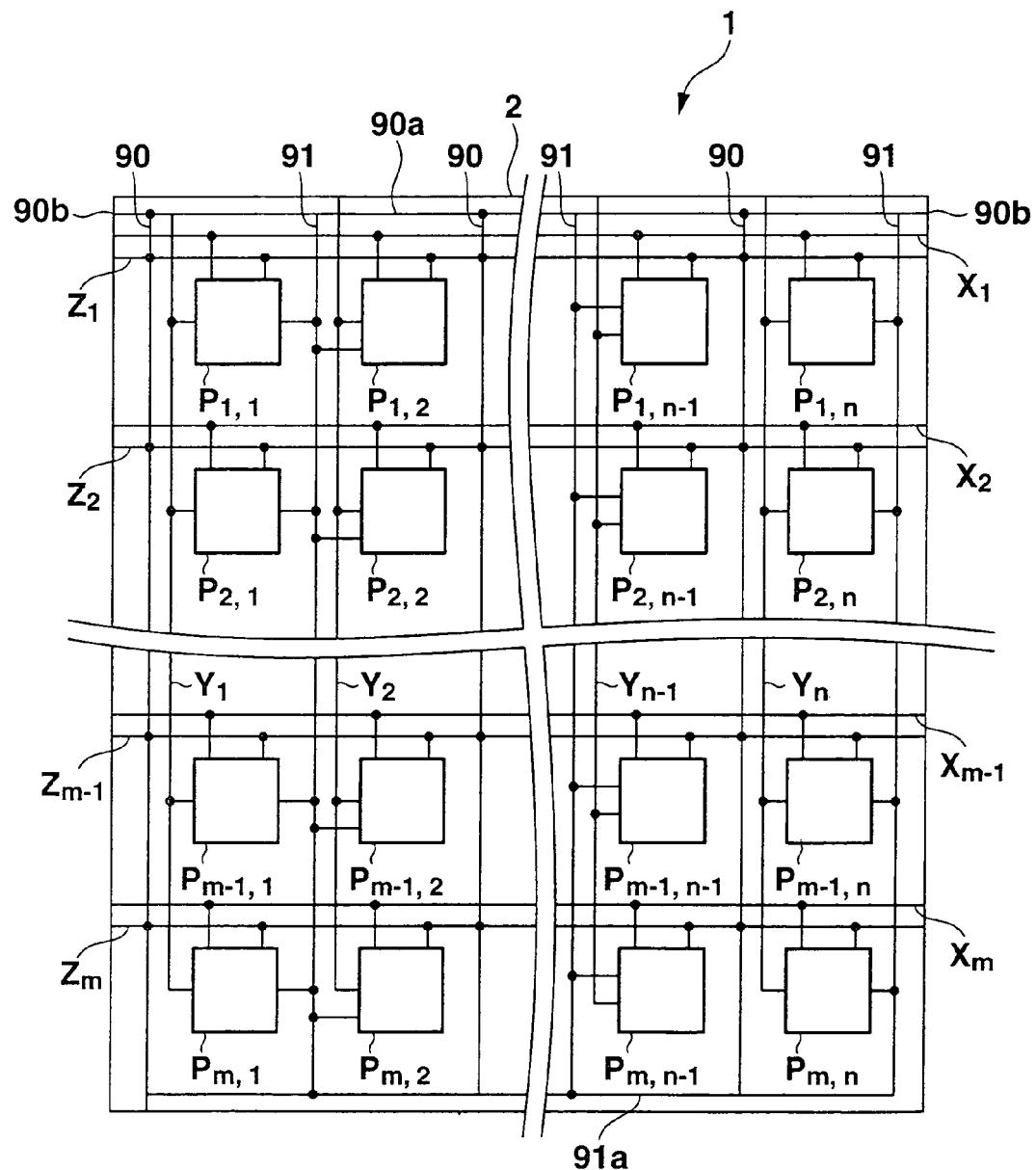
FIG. 20 is a view showing the circuit arrangement of an EL display panel together with an insulating substrate.

FIG. 20 is a schematic view showing an EL display panel 1 of active matrix driving type. As shown in FIG. 20, the EL display panel 1 comprises an insulating substrate 2, n (a plurality of) signal lines $Y_1$ to $Y_n$, m (a plurality of) scan lines $X_1$ to $X_m$, m (a plurality of) supply lines $Z_1$ to $Z_m$, (m×n) pixel circuits $P_{1,1}$ to $P_{m,n}$, a plurality of feed interconnections 90, and a plurality of common interconnections 91. The insulating substrate 2 is optically transparent and has a flexible sheet shape or a rigid plate shape. The signal lines $Y_1$ to $Y_n$ are arrayed on the insulating substrate 2 in parallel to each other. The scan lines $X_1$ to $X_m$ are arrayed on the insulating substrate 2 to be perpendicularly to the signal lines $Y_1$ to $Y_n$ when the insulating substrate 2 is viewed from the upper side. The supply lines $Z_1$ to $Z_m$ are arrayed on the insulating substrate 2 between the scan lines $X_1$ to $X_m$ to be parallel to them so that the supply lines and scan lines alternate. The pixel circuits $P_{1,1}$ to $P_{m,n}$ are arrayed on the insulating substrate 2 in a matrix along the signal lines $Y_1$ to $Y_n$ and scan lines $X_1$ to $X_m$.

The feed interconnections 90 are connected to the supply lines $Z_1$ to $Z_m$ and branched in parallel to the signal lines $Y_1$ to $Y_n$ when viewed from the upper side. The common interconnections 91 are provided between the feed interconnections 90 to be parallel to them such that the common interconnections 91 and feed interconnections 90 alternate.

The sum of the total number of feed interconnections 90 and the total number of common interconnections 91 is (n+1). The feed interconnection 90 or common interconnection 91 is provided to partition each of the left and right sides of each of the pixel circuits $P_{1,1}$ to $P_{m,n}$ in the running direction of the signal lines $Y_1$ to $Y_n$.

The feed interconnections 90 are electrically connected to each other through a lead interconnection 90a arranged on one edge of the insulating substrate 2 and are set to an equipotential by an external clock signal, as will be described later. The lead interconnection 90a is connected to interconnection terminals 90b and 90c at the two ends of the insulating substrate 2. Since an equipotential is applied from an external driving circuit to the left terminals 90b and 90c, a current can quickly be supplied to all the feed interconnections 90. The lead interconnection 90a also functions as a partition wall to partition, in film formation, organic EL layers 20b together with the feed interconnections 90 and common interconnections 91, as will be described later.

The common interconnections 91 are connected to each other through a lead interconnection 91a arranged on another edge of the insulating substrate 2 on the opposite side of the edge with the interconnection 90a. A common voltage Vcom is applied to the common interconnections 91. The lead interconnections 91a also function as partition walls to partition, in film formation, the organic EL layers 20b together with the feed interconnections 90 and common interconnections 91, as will be described later.

In the following description, the direction in which the signal lines $Y_1$ to $Y_n$ run will be defined as the vertical direction (column direction), and the direction in which the scan lines $X_1$ to $X_m$ run will be defined as the horizontal direction (row direction). In addition, m and n are natural numbers ($m \geq 2$, $n \geq 2$). The subscript added to a scan line X represents the sequence from the top in FIG. 20. The subscript added to a supply line Z represents the sequence from the top in FIG. 20. The subscript added to a signal line Y represents the sequence from the left in FIG. 20. The first subscript added to a pixel circuit P represents the sequence from the top, and the second subscript represents the sequence from the left. More specifically, let i be an arbitrary natural number of 1 to m, and j be an arbitrary natural number of 1 to n, a scan line $X_i$ is the ith row from the top, a supply line $Z_i$ is the ith row from the top, a signal line $Y_j$ is the jth column from the left, and a pixel circuit $P_{i,j}$ is located on the ith row from the top and the jth column from the left. The pixel circuit $P_{i,j}$ is connected to the scan line $X_i$, supply line $Z_i$, and signal line $Y_j$.

In the EL display panel 1, regions partitioned in a matrix by the scan lines $X_1$ to $X_m$ and signal lines $Y_1$ to $Y_n$ form pixels. Each of the pixel circuits $P_{1,1}$ to $P_{m,n}$ is provided in one region.

[Circuit Arrangement of Pixel Circuit]

Figure 21:
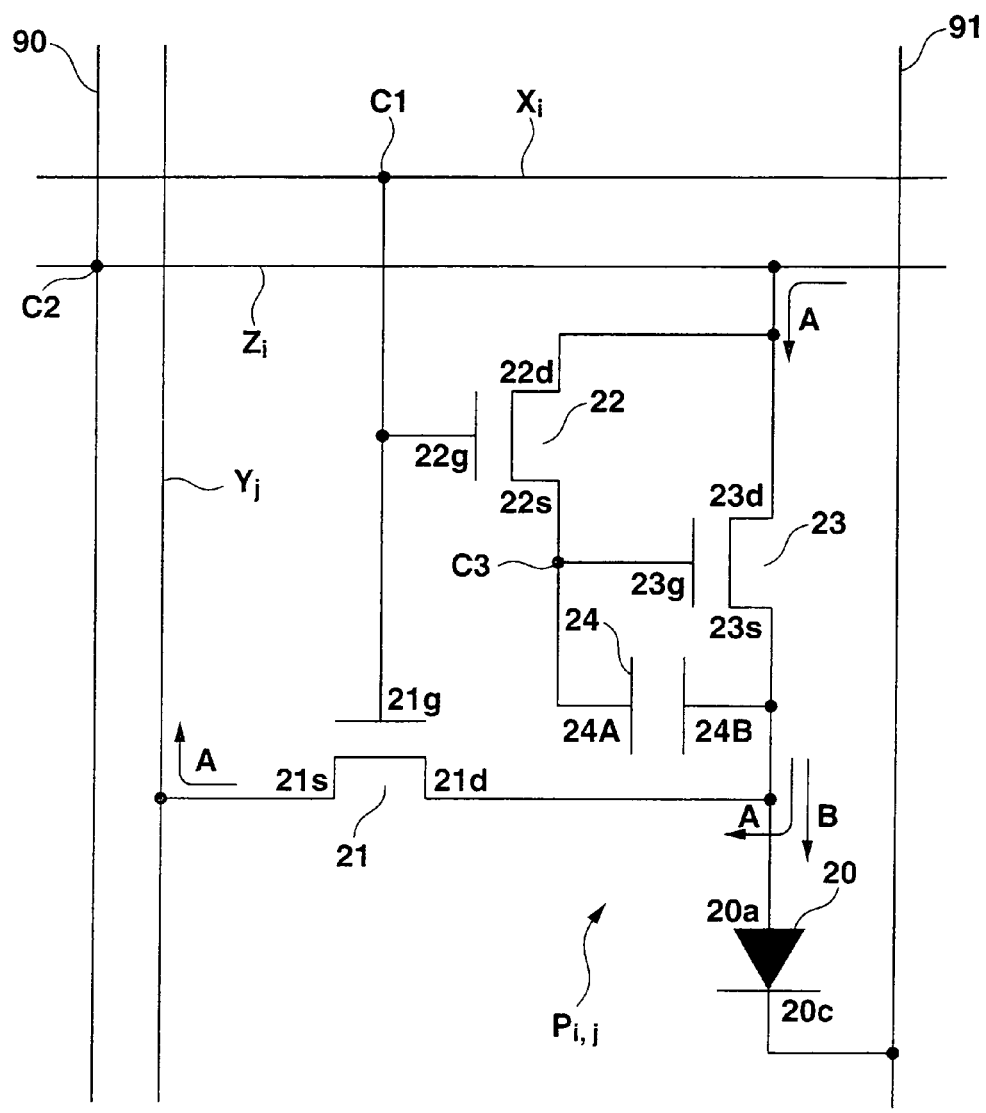
FIG. 21 is an equivalent circuit diagram of a pixel circuit of the EL display panel.
Figure 22:
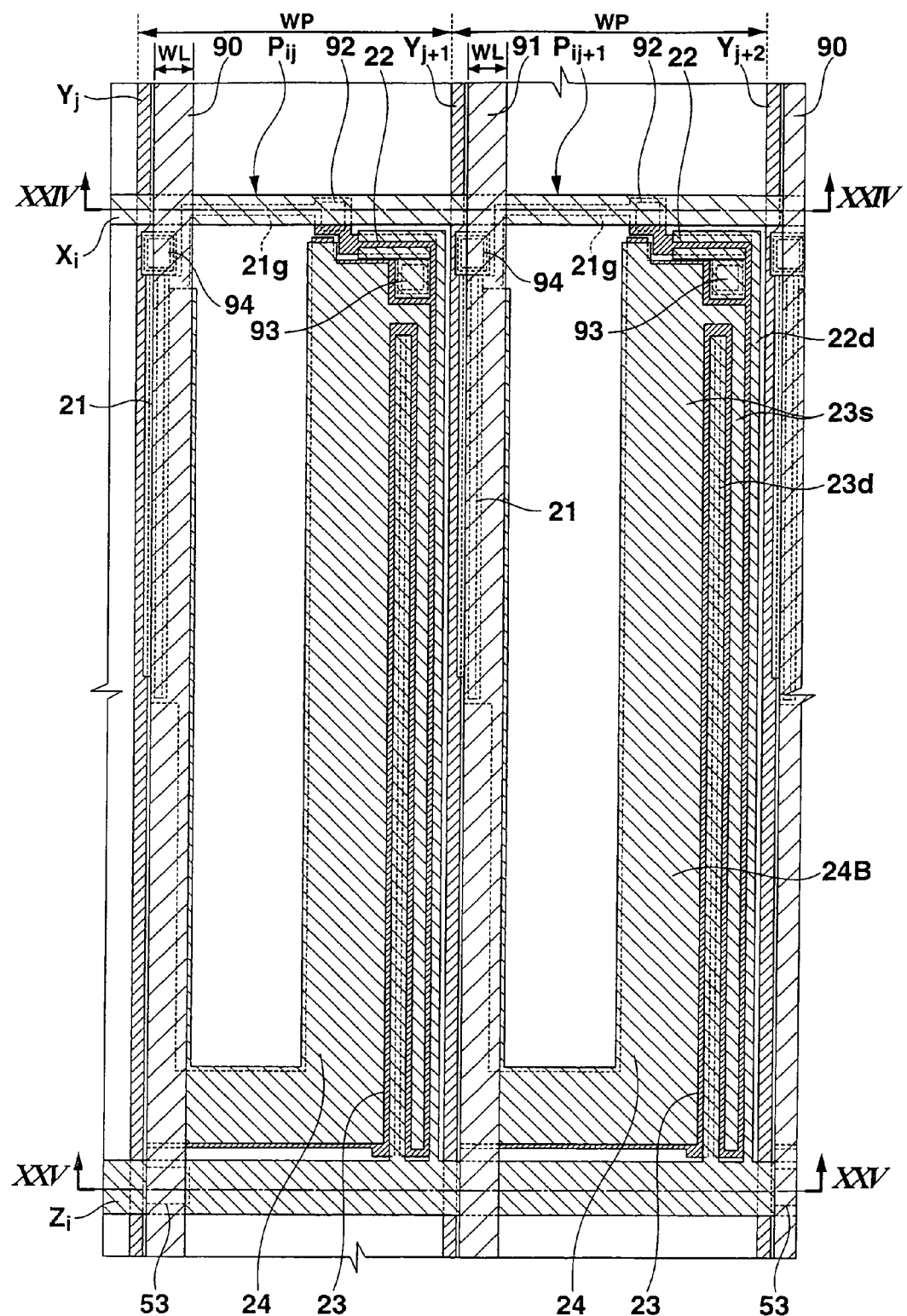
FIG. 22 is a plan view showing the electrodes of pixel circuits $P_{i,j}$ and $P_{i,j+1}$ of the EL display panel.

The pixel circuits $P_{1,1}$ to $P_{m,n}$ have the same structure. The arbitrary pixel circuit $P_{i,j}$ of the pixel circuits $P_{1,1}$ to $P_{m,n}$ will be described. FIG. 21 is an equivalent circuit diagram of the pixel circuit $P_{i,j}$. FIG. 22 is a plan view mainly showing the electrodes of the pixel circuit $P_{i,j}$ and pixel circuit $P_{i,j+1}$.

The pixel circuit $P_{i,j}$ comprises an organic EL element 20 serving as a pixel, and a switch transistor 21, holding transistor 22, driving transistor 23, and capacitor 24 which are arranged around the organic EL element 20.

As shown in FIG. 21, in the switch transistor 21 of the pixel circuit $P_{i,j}$, a source 21s is electrically connected to the signal line $Y_j$. A drain 21d of the transistor 21 is electrically connected to a pixel electrode 20a of the organic EL element 20, a source 23s of the driving transistor 23, and one electrode 24B of the capacitor 24. A gate 21g of the transistor 21 is electrically connected to the scan line $X_i$ and a gate 22g of the holding transistor 22.

In the holding transistor 22, a source 22s is electrically connected to a gate 23g of the driving transistor 23 and the other electrode 24A of the capacitor 24. A drain 22d is electrically connected to the supply line $Z_i$ and a drain 23d of the driving transistor 23. The gate 22g of the transistor 23 is electrically connected to the gate 21g of the switch transistor 21 and the scan line $X_i$.

In the driving transistor 23, the source 23s is electrically connected to the pixel electrode 20a of the organic EL element 20, the drain 21d of the switch transistor 21, and the electrode 24B of the capacitor 24. The drain 23d of the transistor 23 is electrically connected to the supply line $Z_i$ and the drain 22d of the holding transistor 22. The gate 23g of the same transistor is electrically connected to the source 22s of the holding transistor 22 and the electrode 24A of the capacitor 24.

The entire EL display panel 1 is viewed from the upper side, and a focus is placed on only the switch transistors 21 of the pixel circuits $P_{1,1}$ to $P_{m,n}$. The plurality of switch transistors 21 are arrayed in a matrix on the insulating substrate 2. When a focus is placed on only the holding transistors 22 of the pixel circuits $P_{1,1}$ to $P_{m,n}$ when viewed from the upper side, the plurality of holding transistors 22 are arrayed in a matrix on the insulating substrate 2. When a focus is placed on only the driving transistors 23 of the pixel circuits $P_{1,1}$ to $P_{m,n}$ when viewed from the upper side, the plurality of driving transistors 23 are arrayed in a matrix on the insulating substrate 2.

[Layer Structure of EL Display Panel]

The layer structure of the EL display panel 1 will be described. The layer structure of the transistors 21 to 23 will be described first.

Figure 23:
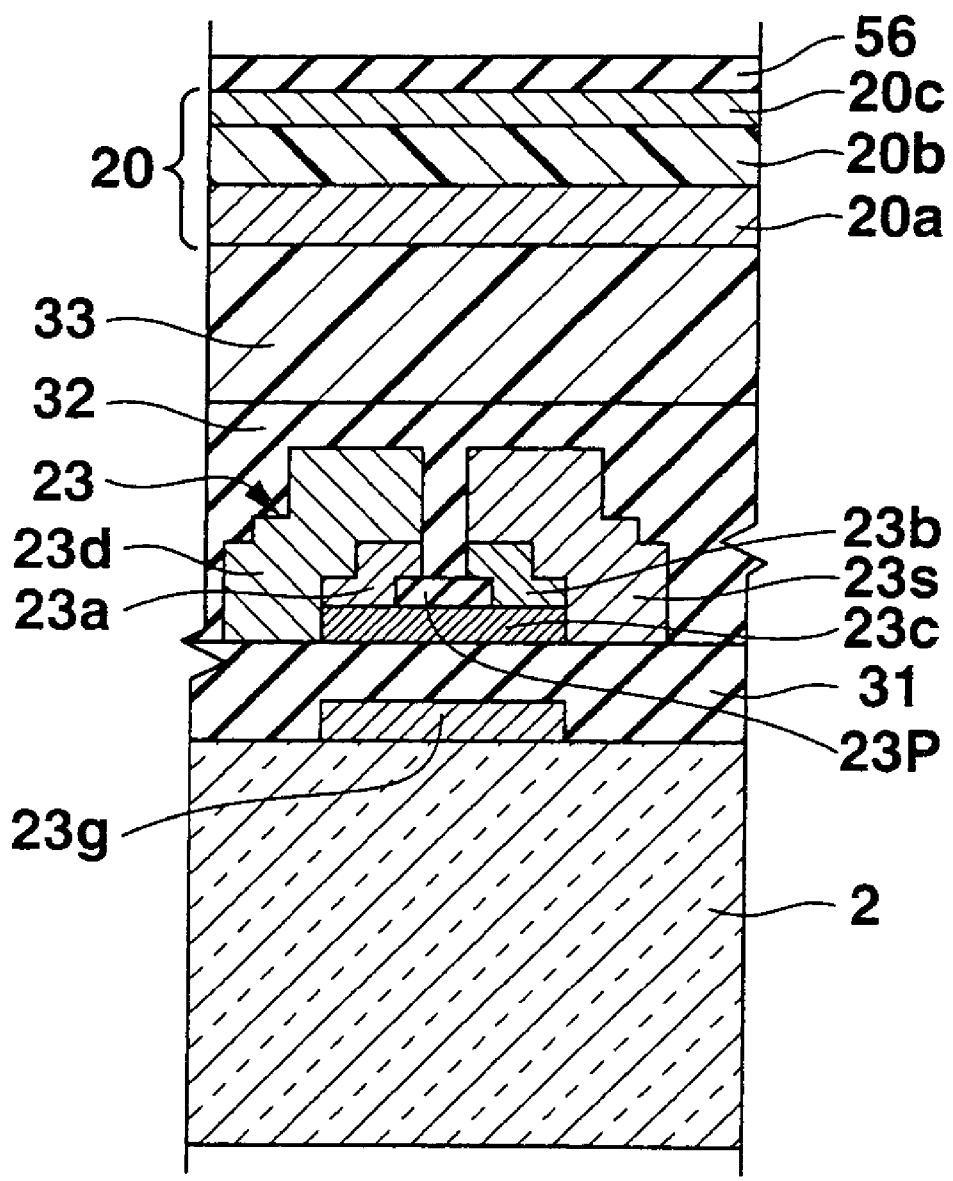
FIG. 23 is a sectional view taken along a plane perpendicular to the channel width of a driving transistor.

FIG. 23 is a sectional view of the driving transistor 23. As shown in FIG. 23, the driving transistor 23 includes the gate 23g, gate insulating film 31, semiconductor film 23c, channel protective film 23p, impurity-doped semiconductor films 23a and 23b, drain 23d, and source 23s. The gate 23g is formed on the insulating substrate 2. The gate insulating film 31 is formed on the gate 23g and substrate 2. The semiconductor film 23c is formed on the gate insulating film 31. The channel protective film 23p is formed on the central portion of the semiconductor film 23c. The impurity-doped semiconductor films 23a and 23b are formed on opposite ends of the semiconductor film 23c to be spaced apart from each other and partially overlap the channel protective film 23p. The drain 23d is formed on the impurity-doped semiconductor film 23a. The source 23s is formed on the impurity-doped semiconductor film 23b. The drain 23d and source 23s can have either a single-layer structure or a layered structure including two or more layers.

The switch transistor 21 and holding transistor 22 also have the same layer structure as the driving transistor 23, and a description of their sectional views will be omitted.

Figure 24:
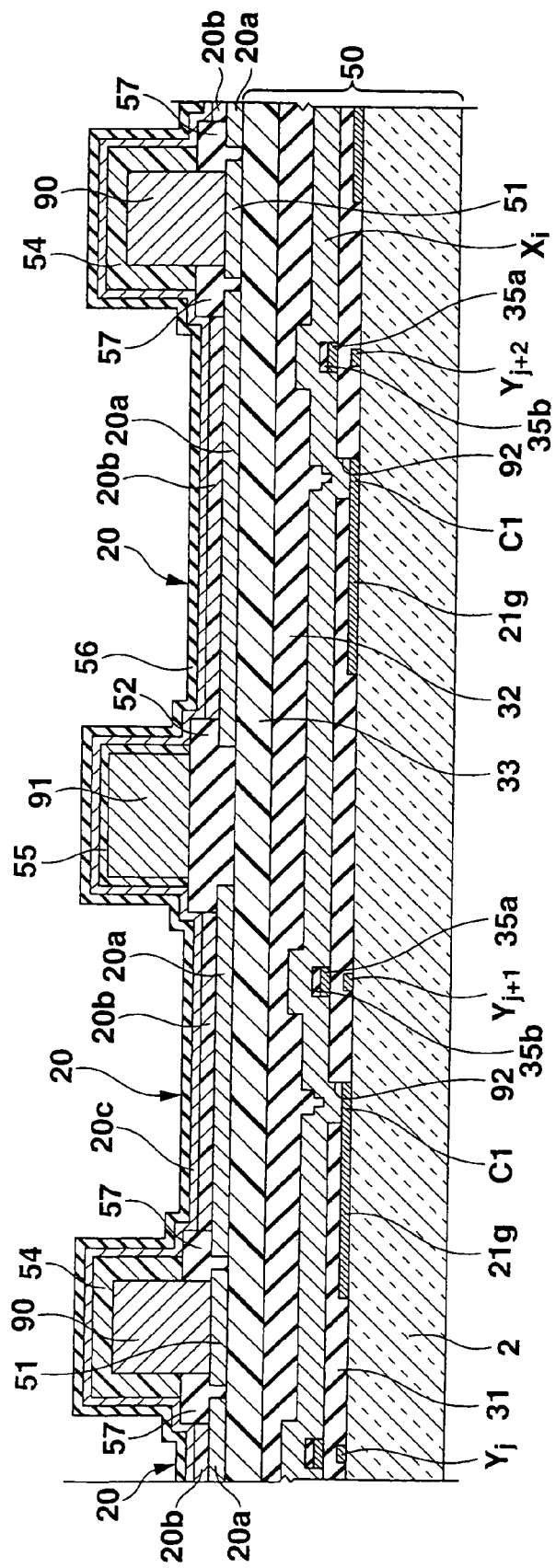
FIG. 24 is a sectional view taken along a line XXIV-XXIV in FIG. 22.
Figure 25:
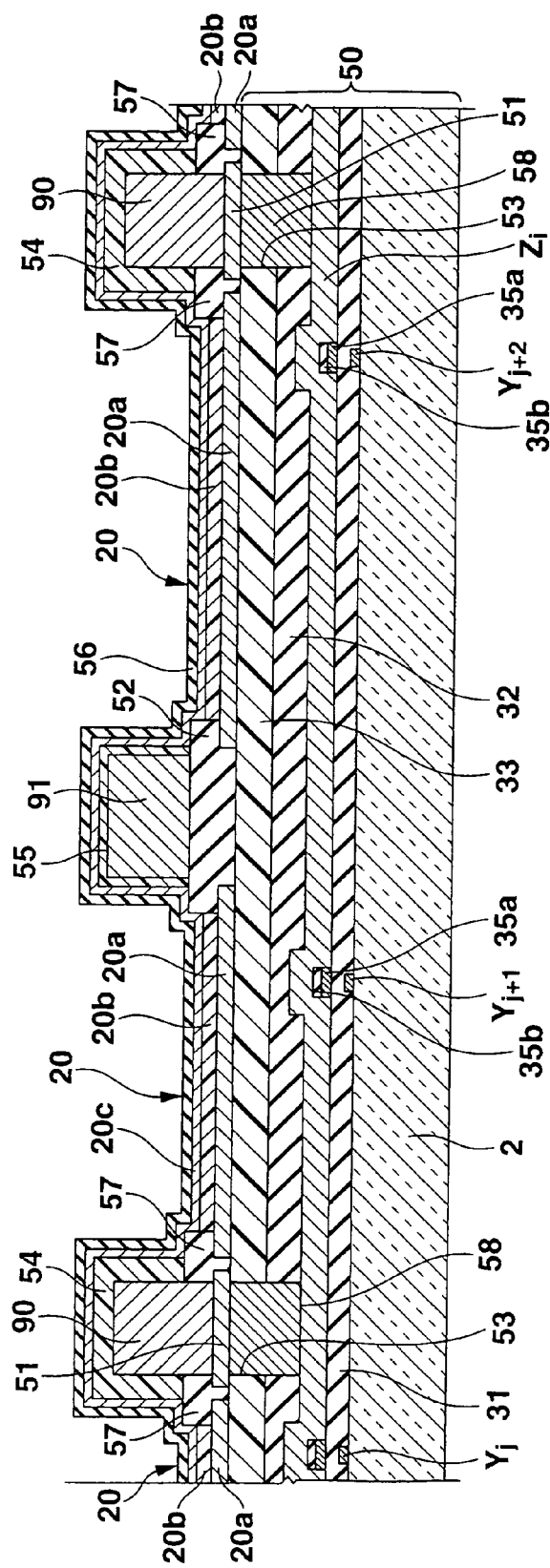
FIG. 25 is a sectional view taken along a line XXV-XXV in FIG. 22.

The relationship between the layers of the transistors 21 to 23 and the capacitor 24, the signal lines $Y_1$ to $Y_n$, the scan lines $X_1$ to $X_m$, and the supply lines $Z_1$ to $Z_m$ will be described next with reference to FIGS. 23 to 25. FIG. 24 is a sectional view taken along a line XXIV-XXIV in FIG. 22 in the direction of thickness of the insulating substrate 2. FIG. 25 is a sectional view taken along a line XXV-XXV in FIG. 22 in the direction of thickness of the insulating substrate 2.

As shown in FIGS. 23 to 25, the gates $21g$ of the switch transistors 21, the gates $22g$ of the holding transistors 22, the gates $23g$ of the driving transistors 23, the electrodes 24A of the capacitors 24, and the signal lines $Y_1$ to $Y_n$ are simultaneously formed, using photolithography and etching, by patterning a conductive film formed on the entire surface of the insulating substrate 2. The signal lines $Y_1$ to $Y_n$ are interconnections to which a gray level current signal having a current value corresponding to the display gray level flows.

The gate insulating film 31 is formed on the entire surface as a film common to all the switch transistors 21, holding transistors 22, and driving transistors 23. The gate insulating film 31 also serves as a dielectric film inserted between the lower electrode 24A and upper electrode 24B of the capacitor 24 and covers the signal lines $Y_1$ to $Y_n$. A protective film $35a$ formed by patterning a film as the prospective semiconductor films $23c$ is provided on each of the signal lines $Y_1$ to $Y_n$. A protective film $35b$ formed by patterning a film as the prospective impurity-doped semiconductor films $23a$ and $23b$ is formed on the protective film $35a$. The protective films $35a$ and $35b$ protect the signal lines $Y_1$ to $Y_n$ from any short circuit formed with any one of the scan lines $X_1$ to $X_m$ or any one of the supply lines $Z_1$ to $Z_m$ through pinholes formed in the gate insulating film 31.

The drains $21d$ and sources $21s$ of the switch transistors 21, the drains $22d$ and sources $22s$ of the holding transistors 22, the drains $23d$ and sources $23s$ of the driving transistors 23, the electrodes 24B of the capacitors 24, the scan lines $X_1$ to $X_m$, and the supply lines $Z_1$ to $Z_m$ are formed by, using photolithography and etching, by patterning a conductive film formed on the entire surface of the gate insulating film 31. As shown in FIG. 22, the scan line $X_i$ is electrically connected to a contact portion C1, which is connected to the gate $21g$ of the switch transistor 21 and the gate $22g$ of the holding transistor 22, through a contact hole 92 formed in the gate insulating film 31. The signal line $Y_j$ is electrically connected to the source $21s$ of the switch transistor 21 through a contact hole 94 formed in the gate insulating film 31. The source $22s$ of the holding transistor 22 is electrically connected to a contact portion C3, which is connected to the gate $23g$ of the driving transistor 23, through a contact hole 93 formed in the gate insulating film 31.

As shown in FIGS. 23 to 25, the switch transistors 21, holding transistors 22, driving transistors 23, scan lines $X_1$ to $X_m$, and supply lines $Z_1$ to $Z_m$ are covered with a protective insulating film 32 formed on the entire surface. The protective insulating film 32 is made of silicon nitride or silicon oxide and insulates and protects the transistors 21 to 23, scan lines $X_1$ to $X_m$, and supply lines $Z_1$ to $Z_m$.

A planarization film 33 is formed on the protective insulating film 32 so that the three-dimensional pattern of the switch transistors 21, holding transistors 22, driving transistors 23, scan lines $X_1$ to $X_m$, and supply lines $Z_1$ to $Z_m$ is eliminated by the planarization film 33. That is, the surface of the planarization film 33 is flat. The planarization film 33 is formed by hardening a resin such as polyimide.

The layered structure from the insulating substrate 2 to the planarization film 33 is called a transistor array substrate 50. In the transistor array substrate 50, the switch transistors 21, holding transistors 22, and driving transistors 23 are arrayed in a matrix when viewed from the upper side.

To use the EL display panel 1 as a bottom emission type, i.e., to use the insulating substrate 2 as the display screen by outputting light from the organic EL elements 20 from the insulating substrate 2, transparent materials are used for the gate insulating film 31, protective insulating film 32, and planarization film 33.

The layer structure formed on the surface of the transistor array substrate 50 will be described next. The pixel electrodes $20a$ are arrayed in a matrix on the surface of the transistor array substrate 50, i.e., the surface of the planarization film 33 in correspondence with the pixel circuits $P_{1,1}$ to $P_{m,n}$. When viewed from the upper side, the pixel electrode $20a$ of the pixel circuit $P_{i,j}$ is formed in a region divided partitioned by the adjacent scan line $X_i$ and supply line $Z_i$ and the adjacent signal line $Y_j$ and signal line $Y_{j+1}$. The pixel electrode $20a$ is electrically connected to the electrode 24B of the capacitor 24, the drain $21d$ of the switch transistor 21, and the source $23s$ of the driving transistor 23 through contact holes formed in the planarization film 33 and protective insulating film 32.

The pixel electrode $20a$ is an electrode functioning as the anode of the organic EL element 20. More specifically, the work function of the pixel electrode $20a$ is preferably relatively high so that holes can efficiently be injected in the organic EL layer $20b$ (to be described later). The pixel electrode $20a$ has a transparency to visible light. As the pixel electrode $20a$, for example, a metal oxide containing, e.g., indium tin oxide (ITO), indium zinc oxide, indium oxide ($In_2O_3$), tin oxide ($SnO_3$), zinc oxide (ZnO), or cadmium tin oxide (CTO) as the major component can be used.

To use the EL display panel 1 as a top emission type, i.e., to use the opposite side of the insulating substrate 2 as the display screen, a reflecting film having conductivity and high visible light reflectance is preferably formed between the pixel electrode $20a$ and the planarization film 33.

The pixel electrodes $20a$ are formed, using photolithography and etching, by patterning a transparent conductive film formed on the entire surface of the planarization film 33. Between the pixel electrodes $20a$ adjacent in the horizontal direction, conductive lines 51 which are electrically disconnected from the pixel electrodes $20a$ and run in the vertical direction are patterned on alternate columns, like the feed interconnections 90, in correspondence with the signal lines $Y_{(j-2k)}, \ldots, Y_{(j-2)}, Y_j, Y_{(j+2)}, \ldots$, (k is a natural number). The conductive lines 51 are patterned together with the pixel electrodes $20a$ by etching a transparent conductive film as the prospective pixel electrodes $20a$. A plurality of trench-shaped insulating lines 57 long in the vertical direction are formed on left and right edge portions of the conductive lines 51. The feed interconnections 90 are formed on the conductive lines 51 exposed between the adjacent insulating lines 57.

Between the pixel electrodes $20a$ adjacent in the horizontal direction, conductive lines 52 which are electrically disconnected from the pixel electrodes $20a$ and run in the vertical direction are patterned on alternate columns, like the common interconnections 91, in correspondence with the signal lines $Y_{(j-2k+1)}, \ldots, Y_{(j-1)}, Y_{(j+1)}, Y_{(j+3)}, \ldots$, (k is a natural number). The both sides of the insulating films 52 partially overlap the edge portions of the pixel electrodes $20a$ to increase the opening ratio. However, they may not overlap the edge portions of the pixel electrodes $20a$. Of the insulating films 52, the insulating films 52 which do not overlap the conductive lines 51 have the common interconnections 91 formed thereon.

The feed interconnections 90 are much thicker than the insulating films 52 and rise from the insulating films 52. The feed interconnections 90 are formed by electroplating and are therefore much thicker than the signal lines $Y_1$ to $Y_n$, scan lines $X_1$ to $X_m$, supply lines $Z_1$ to $Z_m$, and the gates, sources, and drains of the transistors 21 to 23. As shown in FIGS. 22 and 25, contact holes 53 are formed in the planarization film 33 and protective insulating film 32 at portions where the feed interconnections 90 and supply lines $Z_1$ to $Z_m$ cross when viewed from the upper side. Conductive pads 58 are buried in the contact holes 53. The conductive line 51 and feed interconnection 90 are sequentially stacked on the conductive pad 58. Hence, as shown in the circuit diagram of FIG. 21, the feed interconnection 90 is electrically connected to the supply lines $Z_1$ to $Z_m$ through contact portions C2 and also electrically connected to the drains 22d and 23d of the transistors 22 and 23 of the pixel circuits $P_{i,1}$ to $P_{i,n}$ through the supply line $Z_i$. The conductive pad 58 in the contact hole 53 is formed by electroplating.

Since the common interconnections 91 are also formed by electroplating together with the feed interconnections 90, they are much thicker than the signal lines $Y_1$ to $Y_n$, the scan lines $X_1$ to $X_m$, the supply lines $Z_1$ to $Z_m$, and the gates, sources, and drains of the transistors 21 to 23. The common interconnections 91 and feed interconnections is made of copper, gold, or nickel, or a layered body thereof.

A liquid repellent insulating film 54 having water repellency and/or oil repellency is formed on the surface of each feed interconnection 90. The liquid repellent insulating films 54 are made of a fluoroplastic electrodeposition coating and formed by electrodeposition coating.

A liquid repellent conductive film 55 having water repellency and/or oil repellency is formed on the surface of each common interconnection 91. The liquid repellent conductive films 55 are formed by reducing and eliminating hydrogen atoms (H) of one or two mercapto groups (—SH: also called a thiol group) of triazyl-trithiol expressed by chemical formula (1), and oxidizing and adsorbing sulfur atoms (S) in the surfaces of the common interconnections 91 as a metal.

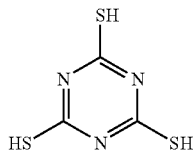

In the liquid repellent conductive film 55, triazyl-trithiol molecule units are formed very thin on the surface of the common interconnection 91. For this reason, the liquid repellent conductive film 55 has a very low resistance in the direction of thickness and rarely has insulating properties. To make the water repellency and oil repellency more effective, a triazinethiol derivative in which an alkyl fluoride group substitute for one or two mercapto groups of triazyl-trithiol may be used in place of triazyl-trithiol. Such a triazyl compound can selectively be coated and bonded to a metal like the liquid repellent conductive film 55. More specifically, an aqueous solution of 6-dimethylamino-1,3,5-triazine-2, and 4-dithiol-sodium salt is prepared at a concentration of $10^{-3}$ mol/L. When the common interconnection 91 is dipped in the aqueous solution at a liquid temperature of 26° C. for a dipping time of 30 min, the liquid repellent conductive film 55 having a thickness of about 0.7 nm is formed on the surface of the common interconnection 91 (the thickness is a measured value by ellipsometer). Alternatively, an aqueous solution of 6-didodecylamino-1,3,5-triazine-2, and 4-dithiol-sodium salt is prepared at a concentration of $10^{-3}$ mol/L. When the common interconnection 91 is dipped in the aqueous solution at a liquid temperature of 46° C. for a dipping time of 30 min, the liquid repellent conductive film 55 having a thickness of about 1.8 nm is formed on the surface of the common interconnection 91 (the thickness is a measured value by ellipsometer).

Figure 26:
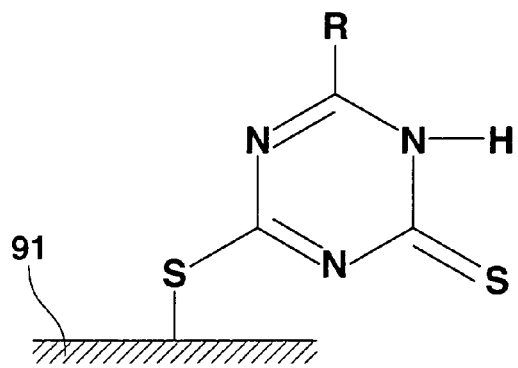
FIG. 26 is a schematic view showing the coating structure of a liquid repellent conductive film.

FIG. 26 is a view schematically showing the coating structure of the liquid repellent conductive film 55. Referring to FIG. 26, a substituent R is, e.g., dimethylamino or didodecylamino.

The organic EL layer 20b of the organic EL element 20 is formed on the pixel electrode 20a. The organic EL layer 20b is a light-emitting layer of broad sense. The organic EL layer 20b contains a light-emitting material (phosphor) as an organic compound. The organic EL layer 20b has a two-layer structure in which a hole transport layer and a light-emitting layer of narrow sense are formed sequentially from the pixel electrode 20a. The hole transport layer is made of PEDOT (polythiophene) as a conductive polymer and PSS (polystyrene sulfonate) as a dopant. The light-emitting layer of narrow sense is made of a polyfluorene-based light-emitting material.

The organic EL layer 20b is formed by wet coating (e.g., ink-jet method) after coating of the liquid repellent insulating film 54 and liquid repellent conductive film 55. In this case, an organic compound-containing solution containing an organic compound as the prospective organic EL layer 20b is applied to the pixel electrode 20a. The liquid level of the organic compound-containing solution is higher than the top of the insulating line 52 and that of the insulating line 57. The thick feed interconnection 90 and common interconnection 91 whose top is much higher than those of the insulating line 52 and insulating line 57 are provided between the pixel electrodes 20a adjacent in the horizontal direction. The feed interconnection 90 and common interconnection 91 prevent the organic compound-containing solution applied to a pixel electrode 20a from leaking to the pixel electrodes 20a adjacent in the horizontal direction. In addition, the feed interconnection 90 is coated with the liquid repellent insulating film 54 having the water repellency and/or oil repellency. The common interconnection 91 is coated with the liquid repellent conductive film 55 having water repellency and/or oil repellency. The liquid repellent insulating film 54 and liquid repellent conductive film 55 repel the organic compound-containing solution applied to the pixel electrode 20a. The organic compound-containing solution applied to the pixel electrode 20a is never deposited excessively thick near the edge of the insulating line 52 as compared to the center of the pixel electrode 20a. Hence, the organic EL layer 20b formed by drying the organic compound-containing solution can have a uniform thickness.

Figure 27:
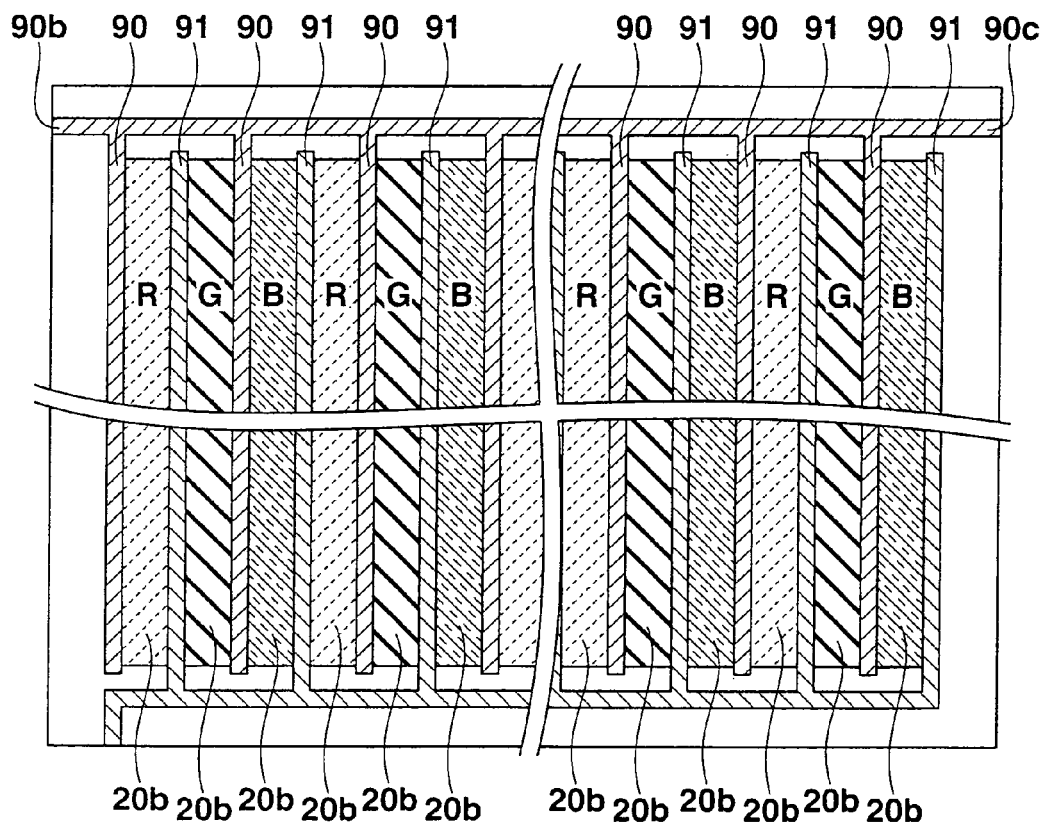
FIG. 27 is a schematic plan view showing the layout of the organic EL layers of the EL display panel.

When the organic EL layers 20b are formed in the above-described way, a stripe structure including a region R where the organic EL layer 20b to emit red light, a region G where the organic EL layer 20b to emit green light, and a region B where the organic EL layer 20b to emit blue light is formed, as shown in FIG. 27. A plurality of pixels in the same column emit light of the same color.

When viewed from the upper side, the applied organic compound-containing solution is uniformly distributed vertically in each column because its left and right sides are partitioned by the feed interconnection 90 or common interconnection 91. Hence, the plurality of organic EL layers 20b arrayed in the vertical direction have the same layer structure and emit light of the same color. In the plurality of organic EL layers 20b arrayed in line in the horizontal direction, the light-emitting layers of narrow sense are arrayed to sequentially repeat red light emission, green light emission, and blue light emission. The hole transport layers of pixels that emit light of different colors may use the same material.

The organic EL layer 20b need not always have the two-layer structure. A three-layer structure including a hole transport layer, a light-emitting layer of narrow sense, and an electron transport layer sequentially from the pixel electrode 20a may be employed. A single-layer structure including a light-emitting layer of narrow sense may be used. A layered structure having an electron or hole injection layer inserted between appropriate layers in one of the above layer structures may be employed. Any other layered structures can also be used.

A counter electrode 20c functioning as the cathode of the organic EL element 20 is formed on the organic EL layer 20b. The counter electrode 20c is a common electrode commonly formed for all pixels. The counter electrode 20c formed on the entire surface covers the common interconnection 91 while sandwiching the liquid repellent conductive film 55 between them and the feed interconnection 90 while sandwiching the liquid repellent insulating film 54. For this reason, the counter electrode 20c is electrically connected to the common interconnection 91, as shown in the circuit diagram of FIG. 21. To the contrary, the counter electrode 20c is insulated from the feed interconnection 90.

As shown in FIGS. 23 to 25, the counter electrode 20c is formed from a material having a work function lower than the pixel electrode 20a. The counter electrode 20c is preferably made of, e.g., a single substance selected from magnesium, calcium, lithium, barium, indium, and a rare earth metal, or an alloy containing at least one of these single substances. The counter electrode 20c may have a layered structure in which the layers of various kinds of materials described above are stacked, or a layered structure in which a metal layer hard to oxidize is deposited in addition to the layers of various kinds of materials described above to lower the sheet resistance. More specifically, a layered structure including a highly pure barium layer having a low work function and provided on the interface side contacting the organic EL layer 20b, and an aluminum layer provided to cover the barium layer, or a layered structure including a lithium layer on the lower side and an aluminum layer on the upper side can be used. In a top emission structure, the counter electrode 20c may be a transparent electrode having the above-described thin film with a low work function and a transparent conductive film made of, e.g., ITO on the thin film.

A sealing insulating film 56 is formed on the counter electrode 20c. The sealing insulating film 56 is an inorganic or organic film provided to cover the entire counter electrode 20c to prevent its degradation.

Conventionally, in an EL display panel having a top emission structure, at least part of the counter electrode 20c is formed as a transparent electrode made of, e.g., a metal oxide having a sufficiently high resistance value. The sheet resistance cannot be sufficient low unless the material is sufficiently thick. When the material is thick, the transmission of the organic EL element inevitably decreases. The larger the screen becomes, the harder a uniform potential is obtained in a plane. Hence, the display characteristic degrades. In this embodiment, however, the plurality of common interconnections 91 with a low resistance are provided of obtain a sufficient thickness in the vertical direction. Hence, the sheet resistance value of the entire cathode electrodes of the organic EL elements 20 can be decreased together with the counter electrode 20c so that a sufficient large current can be supplied uniformly in a plane. In this structure, the common interconnections 91 reduces the sheet resistance of the cathode electrode. For this reason, the transmittance can be increased by forming the counter electrode 20c thin. In a top emission structure, the pixel electrode 20a may be made of a reflecting material.

[EL Display Panel Driving Method]

Figure 28:
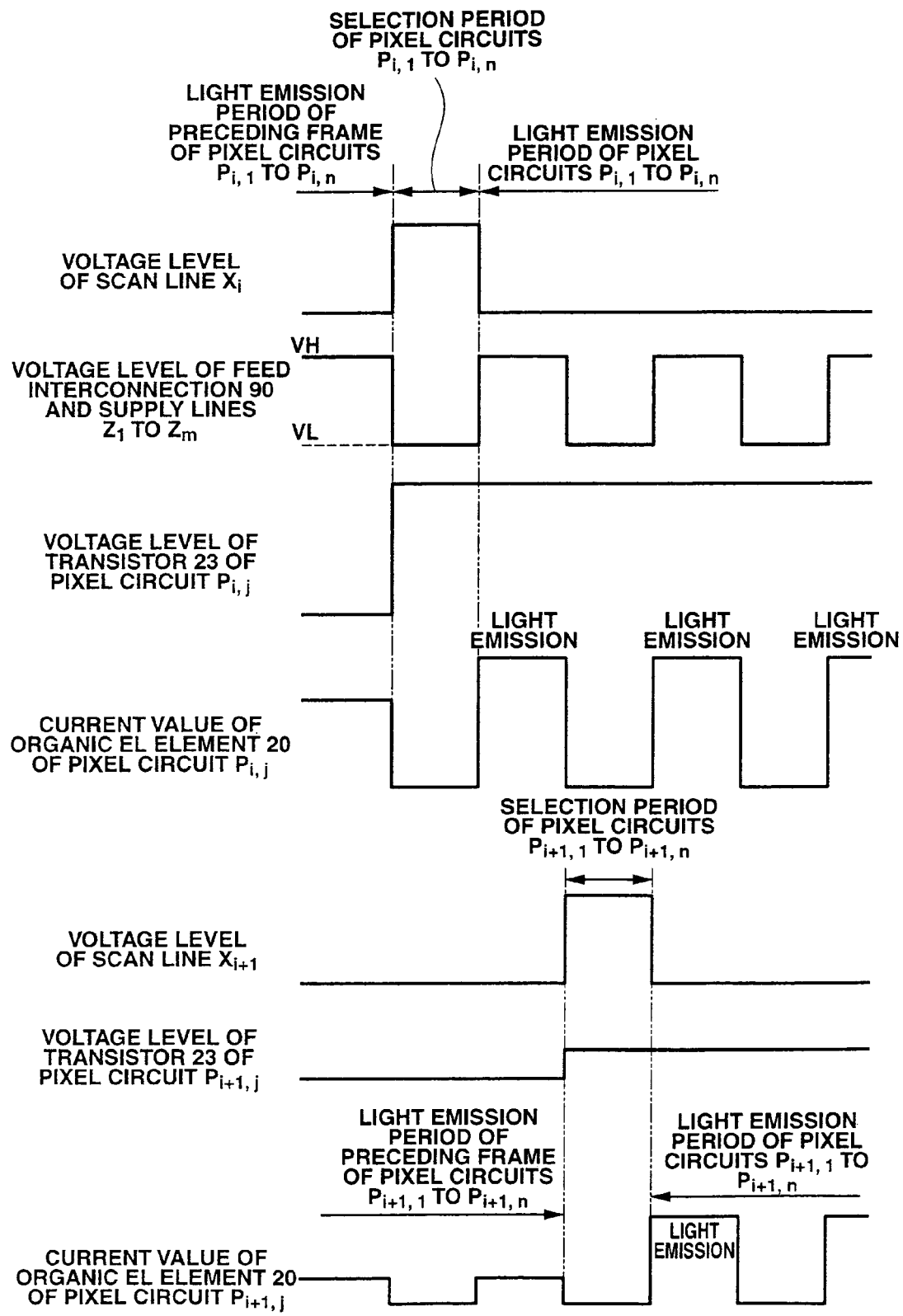
FIG. 28 is a timing chart for explaining the operation of the EL display panel.

The EL display panel 1 can be driven by the active matrix method in the following way. As shown in FIG. 28, an oscillation circuit outputs a clock signal to the feed interconnections 90 and supply lines $Z_1$ to $Z_m$. A scan-side driver sequentially outputs a shift pulse of high level to the scan lines $X_1$ to $X_m$ in this order (the scan line $X_1$ next to the scan line $X_m$), thereby sequentially selecting the scan lines $X_1$ to $X_m$. While the scan-side driver is outputting the shift pulse to one of the scan lines $X_1$ to $X_m$, the clock signal from the oscillation circuit changes to low level. When the scan-side driver selects the scan lines $X_1$ to $X_m$, a data-side driver supplies a pull-out current (current signal) as the write current to all the signal lines $Y_1$ to $Y_n$ through the source-to-drain paths of the driving transistors 23. The counter electrode 20c and feed interconnections 90 are held at the predetermined common voltage Vcom (e.g., ground=0V).

During the selection period of the scan line $X_i$, the shift pulse is output to the scan line $X_i$ of the ith row so that the switch transistor 21 and holding transistor 22 are turned on. In each selection period, the potential on the data-side driver side is equal to or lower than the clock signal output to the feed interconnections 90 and supply lines $Z_1$ to $Z_m$. The low level of the clock signal is set to be equal to or lower than the common voltage Vcom. At this time, no current flows from the organic EL elements 20 to the signal lines $Y_1$ to $Y_n$. As shown in FIG. 21, a write current (pull-out current) having a current value corresponding to the gray level is supplied from the data-side driver to the signal lines $Y_1$ to $Y_n$, as indicated by an arrow A. In the pixel circuit $P_{i,j}$, the write current (pull-out current) to the signal line $Y_j$ flows from the feed interconnection 90 and supply line $Z_i$ through the source-to-drain path of the driving transistor 23 and the source-to-drain path of the switch transistor 21. The current value of the current flowing through the source-to-drain path of the driving transistor 23 is uniquely controlled by the data-side driver. The data-side driver sets the current value of the write current (pull-out current) in accordance with an externally input gray level. While the write current (pull-out current) is flowing, the voltage between the gate 23g and source 23s of the driving transistor 23 of each of the pixel circuits $P_{i,1}$ to $P_{i,n}$ of the ith row is forcibly set in accordance with the current value of the write current (pull-out current) flowing to the signal lines $Y_1$ to $Y_n$, i.e., the current value of the write current (pull-out current) flowing between the drain 23d and source 23s of the driving transistor 23 independently of the change over time in the Vg-Ids characteristic of the driving transistor 23. Charges with a magnitude corresponding to the level of this voltage are stored in the capacitor 24 so that the current value of the write current (pull-out current) is converted into the voltage level between the gate 23g and source 23s of the third transistor 23. In the subsequent light emission period, the scan line $X_i$ changes to low level so that the switch transistor 21 and holding transistor 22 are turned off. The charges on the side of the electrode 24A of the capacitor 24 are confined by the holding transistor 22 in the OFF state, and a floating state is set. Hence, even when the voltage of the source 23s of the transistor 23 is modulated at the time of transition from the selection period to the light emission period, the potential difference between the gate 23g and source 23s of the transistor 23 is maintained. Of the selection period, during a period in which no row is selected, i.e., the clock signal is at high level, and the potential of the feed interconnection 90 and supply line $Z_i$ is higher than the potential Vcom of the counter electrode 20c of the organic EL element 20 and the feed interconnection 90, the driving current flows from the feed interconnection 90 and supply line $Z_i$ with a higher potential to the organic EL element 20 through the source-to-drain path of the driving transistor 23 in the direction of arrow B. Hence, the organic EL element emits light. The current value of the driving current depends on the voltage between the gate 23g and source 23s of the driving transistor 23. For this reason, the current value of the driving current during the light emission period equals the current value of the write current (pull-out current) during the selection period. Of the selection period, during a period in which any row is selected, i.e., the clock signal is at low level, the potential of the feed interconnection 90 and supply line $Z_i$ is equal to or lower than the potential Vcom of the counter electrode 20c and feed interconnection 90. Hence, no driving current flows to the organic EL element 20, and no light emission occurs.

More specifically, during the selection period, the switch transistor 21 forms a current path to flow the write current (pull-out current) between the signal line $Y_j$ and the source 23s of the driving transistor 23. The holding transistor 22 forms a current path to flow the write current (pull-out current) between the feed interconnection 90 and the drain 23d of the driving transistor 23.

During the light emission period, the switch transistor 21 closes the current path not to flow the driving current from the source 23s of the driving transistor 23 to the signal line $Y_j$. The holding transistor 22 holds the voltage between the gate 23g and source 23s of the transistor 23 to make the current value of the driving current constant. When the supply line $Z_i$ and feed interconnection 90 change to high level during the light emission period, the driving transistor 23 supplies a current having a magnitude corresponding to the gray level to the organic EL element 20 to drive it in accordance with charges stored between the gate 23g and source 23s during the selection period.

[First Modification]

The present invention is not limited to the above-described embodiments, and various changes and modifications can be made without departing from the spirit and scope of the present invention.

In the above embodiments, the first to third transistors 21 to 23 have been explained as N-channel field effect transistors. The transistors 21 to 23 may be P-channel field effect transistors. In this case, the relationship between the sources 21s, 22s, and 23s of the transistors 21 to 23 and the drains 21d, 22d, and 23d of the transistors 21 to 23 is reversed in the circuit diagram shown in FIG. 2. For example, when the driving transistor 23 is a P-channel field effect transistor, the drain 23d of the driving transistor 23 is electrically connected to the pixel electrode 20a of the organic EL element 20. The source 23s is electrically connected to the supply line $Z_i$.

[Second Modification]

In the above-described embodiments, the three transistors 21 to 23 are provided per pixel. The present invention can be applied to any EL display panel having a driving transistor whose source or drain is connected to an organic EL element independently of the number of transistors and whether the panel is current-driven or voltage-driven.

[Third Modification]

When the transistors 21 to 23 are P-channel field effect transistors, the relationship between the sources 21s, 22s, and 23s of the transistors 21 to 23 and the drains 21d, 22d, and 23d of the transistors 21 to 23 is reversed in the circuit diagram shown in FIG. 2, as described above. In addition, the high and low levels of each signal are reversed.

[Fourth Modification]

In the above-described embodiments, the drain 22d of each holding transistor 22 is connected to one of the supply lines $Z_1$ to $Z_m$. However, the present invention is not limited to this. The drain 22d of the holding transistor 22 of each of the pixel circuits $P_{i,1}, P_{i,2}, P_{i,3}, \ldots, P_{i,n}$ may be connected to the scan line $X_i$.

[Fifth Modification]

In the above-described embodiments, the write feed voltage VL serving as the write current and the driving feed voltage VH serving as the driving current are supplied from both of the interconnection terminals 90b and 90c to each feed interconnection 90 to decrease the voltage drop in the feed interconnection 90. If the design tolerates a large voltage drop, the voltages may be supplied from only one of the interconnection terminals 90b and 90c.

[Sixth Modification]

In the above-described embodiments, the first to third transistors 21 to 23 are amorphous silicon transistors. However, the transistors may be made of polysilicon, or any other semiconductor.

[Seventh Modification]

In the second embodiment, the liquid repellent insulating film 54 is formed on the surface of each feed interconnection 90. However, the present invention is not limited to this. Instead of providing the liquid repellent insulating film 54, the liquid repellent conductive film 55 may be formed not only on each common interconnection 91 but also on the surface of each feed interconnection 90. At least one layer of the organic EL layer 20b is formed by using the common interconnection 91 and feed interconnection 90 as liquid repellent partition walls. Then, the counter electrode 20c is formed on the surfaces of the organic EL layers 20b and common interconnections 91 except the surfaces of the feed interconnections 90.

A plurality of modifications described above may be combined if a consistency can be ensured.

What is claimed is:

1. A transistor array substrate comprising:
    a substrate;
    a plurality of driving transistors which are arrayed in a matrix on the substrate, each of the driving transistors having a gate, a source, a drain, and a gate insulating film inserted between the gate, and the source and drain;
    a plurality of signal lines which are patterned together with the gates of said plurality of driving transistors and arrayed to run in a predetermined direction on the substrate;
    a plurality of supply lines which are patterned together with the sources and drains of said plurality of driving transistors and arrayed to cross said plurality of signal lines via the gate insulating film, one of the source and the drain of each of the driving transistors being electrically connected to one of the supply lines; and
    a plurality of feed interconnections which are formed on said plurality of supply lines along said plurality of supply lines, respectively.

2. A substrate according to claim 1, further comprising a plurality of scan lines which are patterned together with the sources and drains of said plurality of driving transistors and arrayed to cross said plurality of supply lines via the gate insulating film.

3. A substrate according to claim 2, which further comprises a plurality of switch transistors which are arrayed in a matrix on the substrate, each of the switch transistors having the gate insulating film inserted between a gate and a source and drain, wherein one of the source and drain of each of said plurality of switch transistors is electrically connected to the other of the source and drain of a corresponding one of said plurality of driving transistors, the gate of each of said plurality of switch transistors is electrically connected to one of the scan lines through a contact hole formed in the gate insulating film, and said other of the source and drain of each of said plurality of switch transistors is electrically connected to one of the signal lines through a contact hole formed in the gate insulating film.

4. A substrate according to claim 2, which further comprises a plurality of holding transistors which are arrayed in a matrix on the substrate, each of the holding transistors having the gate insulating film inserted between a gate and a source and drain, wherein one of the source and drain of each of said plurality of holding transistors is electrically connected to the gate of a corresponding one of said plurality of driving transistors through a contact hole formed in the gate insulating film, the other of the source and drain of each of said plurality of holding transistors is electrically connected to one of: (i) one of the supply lines and (ii) one of the scan lines, and the gate of each of said plurality of holding transistors is electrically connected to one of the scan lines through a contact hole formed in the gate insulating film.

5. A substrate according to claim 1, further comprising a plurality of light-emitting elements each of which is connected to one of the source and drain of a corresponding one of the driving transistors.

6. A substrate according to claim 1, further comprising a data driver which supplies a write current between the drain and source of each of the driving transistors through the one of the supply lines connected thereto.

7. A substrate according to claim 3 further comprising a select driver which selects the scan lines and turns on the switch transistors.

8. A substrate according to claim 1, further comprising a feed driver which is connected to the feed interconnections to, with respect to each of the driving transistors: apply a write feed voltage to supply a write current to the driving transistor through a corresponding one of the feed interconnections in a selection period of the driving transistor, and apply a driving feed voltage to supply a driving current to a light-emitting element through the driving transistor in a light emission period of the driving transistor in accordance with a voltage which is held between the gate and source of the driving transistor in the selection period.

9. A substrate according to claim 1, wherein the feed interconnections have a thickness of 1.31 to 6.00 μm.

10. A substrate according to claim 1, wherein the feed interconnections have a width of 7.45 to 44.00 μm.

11. A substrate according to claim 1, wherein a resistivity of the feed interconnections is 2.1 to 9.6 μΩcm.

12. A substrate according to claim 1, further comprising a plurality of light-emitting elements each of which has a pixel electrode, an EL layer, and a counter electrode and is electrically connected to a corresponding one of the driving transistors, wherein the feed interconnections are formed by patterning a material film which is different from a material film serving as a prospective pixel electrode and a material film serving as a prospective counter electrode and which is thicker than the gates of the driving transistors and the sources and drains of the driving transistors.

13. A display panel comprising:
a substrate;
a plurality of driving transistors which are arrayed in a matrix on the substrate, each of the driving transistors having a gate, a source, a drain, and a gate insulating film inserted between the gate, and the source and drain;
a plurality of signal lines which are patterned together with the gates of said plurality of driving transistors and arrayed to run in a predetermined direction on the substrate;
a plurality of supply lines which are patterned together with the sources and drains of said plurality of driving transistors and arrayed to cross said plurality of signal lines via the gate insulating film, one of the source and the drain of each of driving transistors being electrically connected to one of the supply lines;
a plurality of feed interconnections which are connected to said plurality of supply lines along said plurality of supply lines;
a plurality of pixel electrodes each of which is electrically connected to the other of the source and the drain of a corresponding one of said plurality of driving transistors;
a plurality of light-emitting layers which are formed on said plurality of pixel electrodes, respectively; and
a counter electrode which covers said plurality of light-emitting layers.

14. A panel according to claim 13, further comprising a plurality of scan lines which are patterned together with the sources and drains of said plurality of driving transistors and arrayed to cross said plurality of supply lines via the gate insulating film.

15. A panel according to claim 14, which further comprises a plurality of switch transistors which are arrayed in a matrix on the substrate, each of the switch transistors having the gate insulating film inserted between a gate, and a source and drain, wherein one of the source and drain of each of said plurality of switch transistors is electrically connected to the other of the source and drain of a corresponding one of said plurality of driving transistors, the gate of each of said plurality of switch transistors is electrically connected to one of the scan lines through a contact hole formed in the gate insulating film, and said other of the source and drain of each of said plurality of switch transistors is electrically connected to one of the signal lines through a contact hole formed in the gate insulating film.

16. A panel according to claim 14, which further comprises a plurality of holding transistors which are arrayed in a matrix on the substrate, each of the holding transistors having the gate insulating film inserted between a gate, and a source and drain, wherein one of the source and drain of each of said plurality of holding transistors is electrically connected to the gate of a corresponding one of said plurality of driving transistors through a contact hole formed in the gate insulating film, the other of the source and drain of each of said plurality of holding transistors is electrically connected to one of: (i) one of the supply lines and (ii) one of the scan lines, and the gate of each of said plurality of holding transistors is electrically connected to one of the scan lines through a contact hole formed in the gate insulating film.

17. A panel according to claim 13, wherein the feed interconnections are formed by patterning a material film which is different from a material film serving as a prospective pixel electrode and a material film serving as a prospective counter electrode and which is thicker than the gates of the driving transistors and the sources and drains of the driving transistors.

* * * * *